US009537501B2

(12) United States Patent
Lee et al.

(10) Patent No.: US 9,537,501 B2
(45) Date of Patent: Jan. 3, 2017

(54) IMAGE SENSOR INCLUDING HETEROGENEOUS ANALOG TO DIGITAL CONVERTOR WITH DIFFERENT NOISE CHARACTERISTICS

(71) Applicant: SAMSUNG ELECTRONICS CO., LTD., Suwon-si (KR)

(72) Inventors: Hyeokjong Lee, Yongin-si (KR); Byung-Jo Kim, Seoul (KR); Se-jun Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 141 days.

(21) Appl. No.: 14/546,154

(22) Filed: Nov. 18, 2014

(65) Prior Publication Data

US 2015/0162925 A1   Jun. 11, 2015

(30) Foreign Application Priority Data

Dec. 9, 2013  (KR) ........................ 10-2013-0152425

(51) Int. Cl.
*H01L 27/146*   (2006.01)
*H03M 1/12*   (2006.01)
*H03M 1/56*   (2006.01)

(52) U.S. Cl.
CPC ........... *H03M 1/1295* (2013.01); *H03M 1/123* (2013.01); *H03M 1/56* (2013.01)

(58) Field of Classification Search
CPC ..... H01L 27/146; H03M 1/12; H03M 1/0626; H04N 5/3745

(Continued)

(56) References Cited

U.S. PATENT DOCUMENTS 6,970,195 B1 *  11/2005  Bidermann ........ H04N 1/00307
                                                      348/302
8,106,985 B2    1/2012   Kume
(Continued)

FOREIGN PATENT DOCUMENTS

JP    2004-015712 A    1/2004
JP    2004-056562 A    2/2004
(Continued)

OTHER PUBLICATIONS

Yong Lim, et al., "A 1.1e—Temporal Noise 1/3.2-inch 8Mpixel CMOS Image Sensor using Pseudo-Multiple Sampling", ISSCC2010 Session 22 Image Sensors 22.2, Feb. 10, 2010, pp. 396-398, 2010 IEEE International Solid-State Circuits Conference.

*Primary Examiner* — Que T Le
(74) *Attorney, Agent, or Firm* — Sughrue Mion, PLLC

(57) ABSTRACT

An image sensor in accordance with exemplary embodiments of the inventive concept may include a pixel sensor array which includes an active pixel sensor and an optical black pixel sensor; a first analog to digital converter configured to convert a first sensing signal, which is provided from the active pixel sensor, to a first digital signal; a second analog to digital converter configured to convert a second sensing signal, which is provided from the optical black pixel sensor, to a second digital signal; and an output buffer configured to temporarily store and output the first digital signal and the second digital signal, wherein a plurality of noise characteristics of the second analog to digital converter is different from a plurality of noise characteristics of the first analog to digital converter.

15 Claims, 23 Drawing Sheets

(58) Field of Classification Search
USPC ....... 250/208.1, 214 R, 214.1; 348/297–315; 257/290–292, 440
See application file for complete search history.

(56) References Cited

U.S. PATENT DOCUMENTS

| | | |
|---|---|---|
| 8,111,309 B2 | 2/2012 | Mizuguchi et al. |
| 8,228,402 B2 | 7/2012 | Egawa |
| 8,310,568 B2 | 11/2012 | Taguchi |
| 8,310,569 B2 | 11/2012 | Willassen |
| 8,325,260 B2 | 12/2012 | Yamazaki et al. |
| 8,492,697 B2 | 7/2013 | Neubauer et al. |
| 8,743,248 B2 | 6/2014 | Saito |
| 2008/0297636 A1 | 12/2008 | Mizuguchi et al. |
| 2009/0244338 A1 | 10/2009 | Kume |
| 2010/0053379 A1 | 3/2010 | Willassen |
| 2010/0128150 A1 | 5/2010 | Taguchi |
| 2010/0149394 A1 | 6/2010 | Yamazaki et al. |
| 2010/0302415 A1 | 12/2010 | Egawa |
| 2011/0194003 A1 | 8/2011 | Saito |
| 2012/0025062 A1 | 2/2012 | Neubauer et al. |
| 2012/0138775 A1 | 6/2012 | Cheon et al. |

FOREIGN PATENT DOCUMENTS

| | | |
|---|---|---|
| JP | 2009-033321 A | 2/2009 |
| JP | 4385060 B2 | 12/2009 |
| JP | 2010-004439 A | 1/2010 |
| JP | 2010-147948 A | 7/2010 |
| JP | 2011-040807 A | 2/2011 |
| JP | 2011-120111 A | 6/2011 |
| JP | 5489739 B2 | 5/2014 |

\* cited by examiner

IMAGE SENSOR INCLUDING HETEROGENEOUS ANALOG TO DIGITAL CONVERTOR WITH DIFFERENT NOISE CHARACTERISTICS

CROSS-REFERENCE TO RELATED APPLICATIONS

This U.S. non-provisional patent application claims priority from Korean Patent Application No. 10-2013-0152425, filed on Dec. 9, 2013, the entire contents of which are hereby incorporated by reference.

BACKGROUND

Exemplary embodiments relate to semiconductor devices. In particular, exemplary embodiments relate to an image sensor which includes a heterogeneous analog to digital converter.

A mobile device, such as a smart phone, a tablet PC, a digital camera, a MP3 player, an e-book, etc., is being used more frequently. Most mobile devices are loaded with at least one image sensor to shoot an image. Examples of the at least one image sensor includes a charge coupled device (CCD) and a complementary metal-oxide semiconductor (CMOS) image sensor.

A CCD image sensor has low noise and superior image quality in comparison to a CMOS image sensor. However, a CMOS image sensor has a simple driving type, and can be embodied by various scanning methods. Since a CMOS image sensor can integrate a signal processing circuit in a single chip, the CMOS image sensor can be easily miniaturized. Further, since a CMOS image sensor can use a CMOS process technology, the unit production cost is low. A CMOS image sensor also has very low power consumption and can be easily applied to a mobile device.

A CMOS image sensor includes an analog to digital converter for converting an image signal being sensed by an analog signal to a digital signal. A pixel array of a CMOS image sensor includes a plurality of pixels arranged in a two-dimensional matrix form. Each of the plurality of pixels outputs an image signal from light energy. Each of the plurality of pixels accumulates photocharges corresponding to the amount of light supplied through a photodiode, and outputs a pixel signal of an analog current form according to the accumulated photocharges. The pixel signal is converted into a digital signal by an analog to digital converter (ADC). Thus, a number of ADC circuits which correspond to the number of column lines of the pixel array are needed.

Various noise filtering technologies are being used in a CMOS image sensor to generate a high quality image signal. Among various kinds of noise, horizontal noise (HN) has a characteristic which is easily sensed by the human eye. Thus, various studies for reducing horizontal noise HN are under way. Horizontal noise HN can be processed in the process of converting an analog signal being output from a pixel array of a CMOS image sensor into a digital signal. However, it is difficult to effectively remove horizontal noise HN due to random noise.

SUMMARY

An aspect of the exemplary embodiments may provide an image sensor. The image sensor may include a pixel sensor array which includes an active pixel sensor and an optical black pixel sensor; a first analog to digital converter configured to convert a first sensing signal, which is provided from the active pixel sensor, to a first digital signal; a second analog to digital converter configured to convert a second sensing signal, which is provided from the optical black pixel sensor, to a second digital signal; and an output buffer configured to temporarily store and output the first digital signal and the second digital signal, wherein a plurality of noise characteristics of the second analog to digital converter are different from a plurality of noise characteristics of the first analog to digital converter.

Another aspect of the exemplary embodiments may provide an image sensor. The image sensor may include a pixel sensor array which includes a plurality of active pixel sensors; an analog to digital converter configured to convert a plurality of sensing signals of a same line output from the active pixel sensors to a plurality of digital signals; and an output buffer configured to temporarily store and output the digital signals. The analog to digital converter includes a plurality of heterogeneous analog to digital converting circuits.

Yet another aspect of the exemplary embodiments may provide an image sensor. The image sensor may include a pixel sensor array which includes a plurality of active pixel sensors; a plurality of first analog to digital converter configured to convert a first output signal of the pixel sensor array to a first digital signal, and then output the converted first digital signal in a first operation mode and a second operation mode; and a plurality of second analog to digital converter configured to convert a second output signal of the pixel sensor array to a second digital signal and then output the converted second digital signal in the first operation mode and convert a compensating input signal to the second digital signal and then output the converted second digital signal in the second operation mode.

Another aspect of the exemplary embodiments may provide a pixel sensor array. The pixel sensor array may include an active pixel sensor array which includes a plurality of active pixel sensors arranged in a first matrix form of a first plurality of rows and a first plurality of columns; and an optical black pixel sensor array which includes a plurality of optical black pixel sensors arranged in a second matrix form of the first rows and at least one second column, wherein the optical black pixel sensors are shielded from external light, and wherein the active pixel sensors sense light and convert the sensed light to a plurality of signals to output through the first plurality of columns.

BRIEF DESCRIPTION OF THE DRAWINGS

Exemplary embodiments of the inventive concept will be described below in more detail with reference to the accompanying drawings. The exemplary embodiments of the inventive concept may, however, be embodied in different forms and should not be constructed as limited to the exemplary embodiments set forth herein. Rather, these exemplary embodiments are provided so that this disclosure will be thorough and complete, and will fully convey the scope of the inventive concept to those skilled in the art. Like numbers refer to like elements throughout.

DETAILED DESCRIPTION OF THE EXEMPLARY EMBODIMENTS

Figure 1:
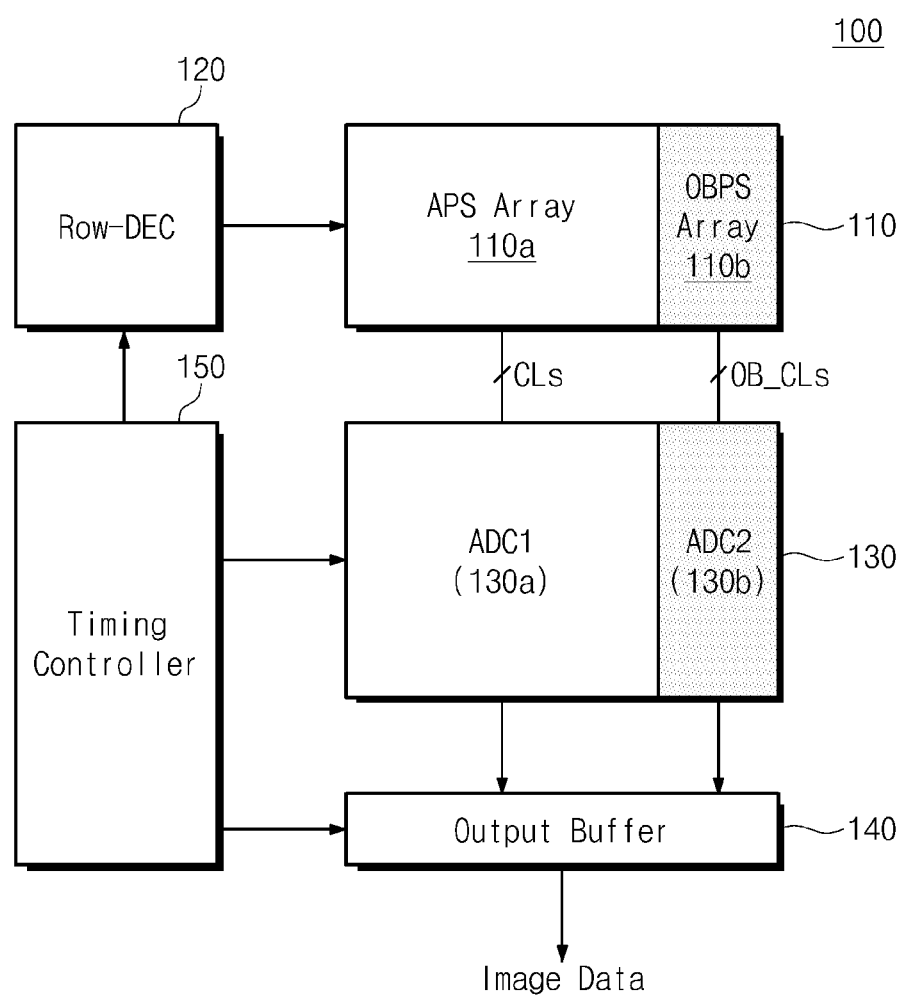
FIG. 1 is a block diagram illustrating an image sensor in accordance with an exemplary embodiment of the inventive concept.

Exemplary embodiments of inventive concepts will be described more fully hereinafter with reference to the accompanying drawings, in which exemplary embodiments are shown. This inventive concept may, however, be embodied in many different forms and should not be construed as limited to the exemplary embodiments set forth herein. Rather, these exemplary embodiments are provided so that this disclosure will be thorough and complete, and will fully convey the scope of the exemplary embodiments to those skilled in the art. In the drawings, the size and relative sizes of layers and regions may be exaggerated for clarity. Like numbers refer to like elements throughout.

FIG. 1 is a block diagram illustrating an image sensor in accordance with an exemplary embodiment. Referring to FIG. 1, an image sensor 100 includes a pixel sensor (PS) array 110, a row decoder 120, an analog to digital converter 130, an output buffer 140, and a timing controller 150.

The pixel sensor array 110 includes an active pixel sensor (APS) array 110a and an optical black pixel sensor (OBPS) array 110b. The pixel sensor array 110 includes a plurality of pixel sensors arranged in a two-dimensional form. Each of the pixel sensors included in the APS array 110a converts an optical signal into an electrical signal. The pixel sensor array 110 can be driven by drive signals such as a select signal SEL, a reset signal RS, and a transmission signal TG from the row decoder 120. In response to drive signals, a pixel signal which is an electrical signal sensed by each pixel is provided to the analog to digital converter 130 through a plurality of column lines CLs and OB_CLs.

The optical black pixel sensor (OBPS) array 110b includes a plurality of optical black pixels. Top surfaces of unit pixel sensors in the OBPS array 110b are covered with a metal. Therefore, incident light from the outside is completely blocked out, and the OBPS array 110b is not affected by incident light. Thus, the OBPS array 110b outputs an optical black signal OB_Pixel on the basis of only electrons being generated from the inside of the unit pixel without a signal being generated by a photoelectric conversion.

A power supply being supplied to optical black pixels of the OBPS array 110b is a same power supply being supplied to unit pixels of the APS array 110a. Thus, noise of the supply power included in an optical black signal OB_Pixel being output from the OBPS array 110b is the same as noise of the power supply included in a pixel signal being output from the APS array 110a. The OBPS array 110b can effectively transmit the same noise as the noise of the power supply generated from the APS array 110a through the optical black signal OB_Pixel.

The row decoder 120 can select any one row of the pixel sensor array 110 under the control of the timing controller 150. The row decoder 120 generates a select signal SEL to select any one row among a plurality of rows. The row decoder 120 sequentially activates a reset signal RS and a transmission signal TG with respect to pixels which correspond to the selected row. Then, a pixel signal Pixel and an optical black signal OB_Pixel of an analog form being generated from each of the pixel sensors of the selected row are output. Each of the pixel signal Pixel and the optical black signal OB_Pixel may be generated in the order of a reference signal and an image signal according to a correlated double sampling (CDS) method.

The analog to digital converter 130 converts a pixel signal Pixel and an optical black signal OB_Pixel, which are transmitted through a plurality of column lines CLs and OB_CLs, to a digital signal. The analog to digital converter 130 includes a plurality of heterogeneous analog to digital converters (ADC). In other words, the analog to digital converter 130 include a first analog to digital converter (ADC1) 130a and a second analog to digital converter (ADC2) 130b. A pixel signal Pixel from the active pixel sensor array 110a and an optical black signal OB_Pixel from the OBPS array 110b are respectively processed by different analog to digital converters. In other words, the pixel signal Pixel from the active pixel sensor array 110a is processed by the ADC1 130a. The optical black signal OB_Pixel from the OBPS array 110b is processed by the ADC2 130b.

An effective filtering of horizontal noise HN generated from the same row is possible by the analog to digital converter 130 which includes the heterogeneous analog to digital converters. In other words, horizontal noise HN can be reduced without increasing the number of pixels of the OBPS array 110b or the number of analog to digital converters ADC which correspond to the pixels.

The output buffer 140 latches image data of a column unit being provided by the analog to digital converter 130 to output the latched imaged data. Under the control of the timing controller 150, the output buffer 140 temporarily stores image data being output from the analog to digital converter 130 and then outputs image data sequentially latched by a column decoder (not shown).

The timing controller 150 controls the row decoder 120, the analog to digital converter 130, and the output buffer 140. In other words, the timing controller 150 generates a control signal for controlling the process of a sensing of an image to an output of the sensed image data according to time information.

The analog to digital converter 130 can reduce horizontal noise HN by applying ADC1 130a and ADC2 130b included in the analog to digital converter 130 to the APS array 110a and the OBPS array 110b.

Figure 2:
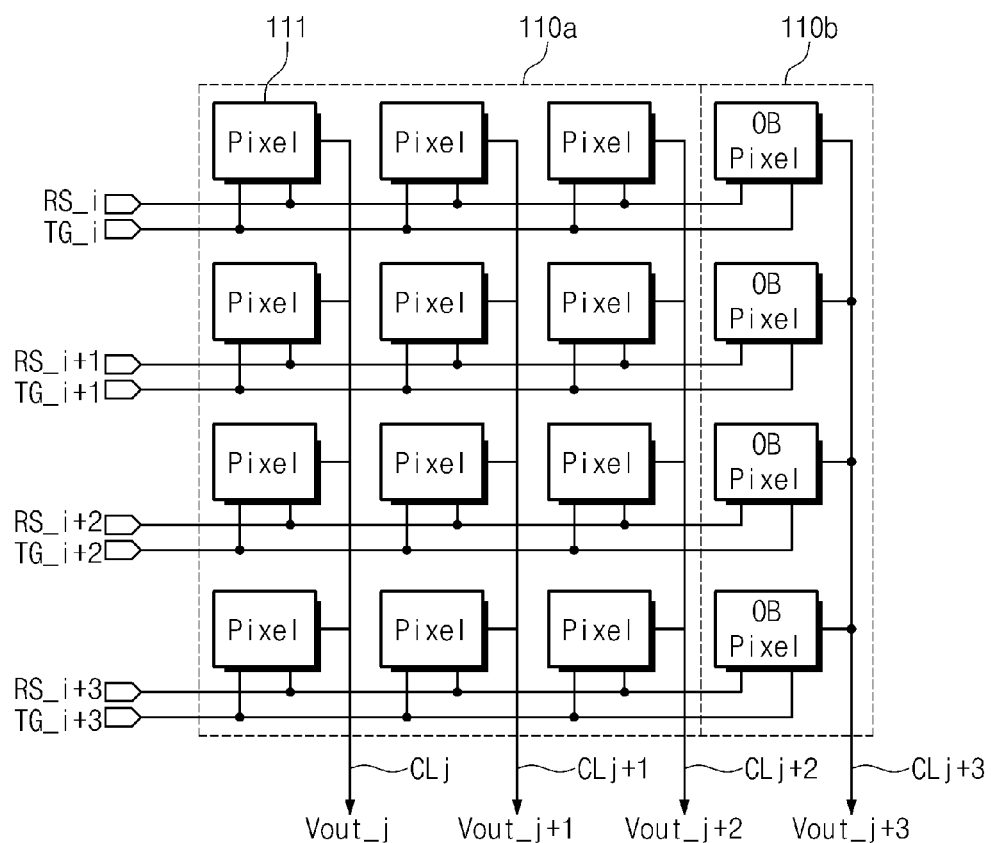
FIG. 2 is a block diagram illustrating a pixel sensor array of the inventive concept.

FIG. 2 is a block diagram illustrating a pixel sensor array of the inventive concept. Referring to FIG. 2, the pixel sensor array 110 includes pixel sensors arranged in a matrix form of a plurality of rows and a plurality of columns. The pixel sensor array 110 can be further divided into an APS array 110a and an OBPS array 110b.

Each pixel sensor of the APS array 110a may include at least one of a red filter, a green filter, and a blue filter. The red filter passes light of a red wavelength band, the green filter passes light of a green wavelength band, and the blue filter passes light of a blue wavelength band. An active pixel sensor 111 may include a plurality of transistors and a photoelectric conversion device. The active pixel 111 senses light using a photoelectric conversion device and converts the sensed light into an electrical signal to output the electrical signal through a plurality of column line CLs.

The OBPS array 110b includes optical black pixel sensors OBPS. Each optical black pixel sensor OBPS may be formed to have the same construction as the active pixel sensor 111 of the APS array 110a. However, since top surfaces of pixel sensors of the OBPS array 110b are covered with a light shield, the pixel sensors are shielded from light entering the pixel sensors from the outside. Thus, the OBPS array 110b is not affected by incident light.

A pixel sensor of the OBPS array 110b has the same row select structure as the APS array 110a. For example, when a sampling of a correlated double sampling (CDS) method is performed, if a rest signal RS_i and a transmission signal TG_i are provided to a selected row (i) of the pixel sensor array 110, voltage signals Vout_j, Vout_j+1, Vout_j+2 and Vout_j+3 which correspond to the rest signal RS_i and the transmission signal TG_i are output from column lines CLj, CLj+1, CLj+2, and CLj+3 of the selected row, respectively. The voltage signals Vout_j, Vout_j+1, Vout_j+2 and Vout_j+3 may be converted into a reference signal REF and an image signal IMG at the same time.

Figure 3:
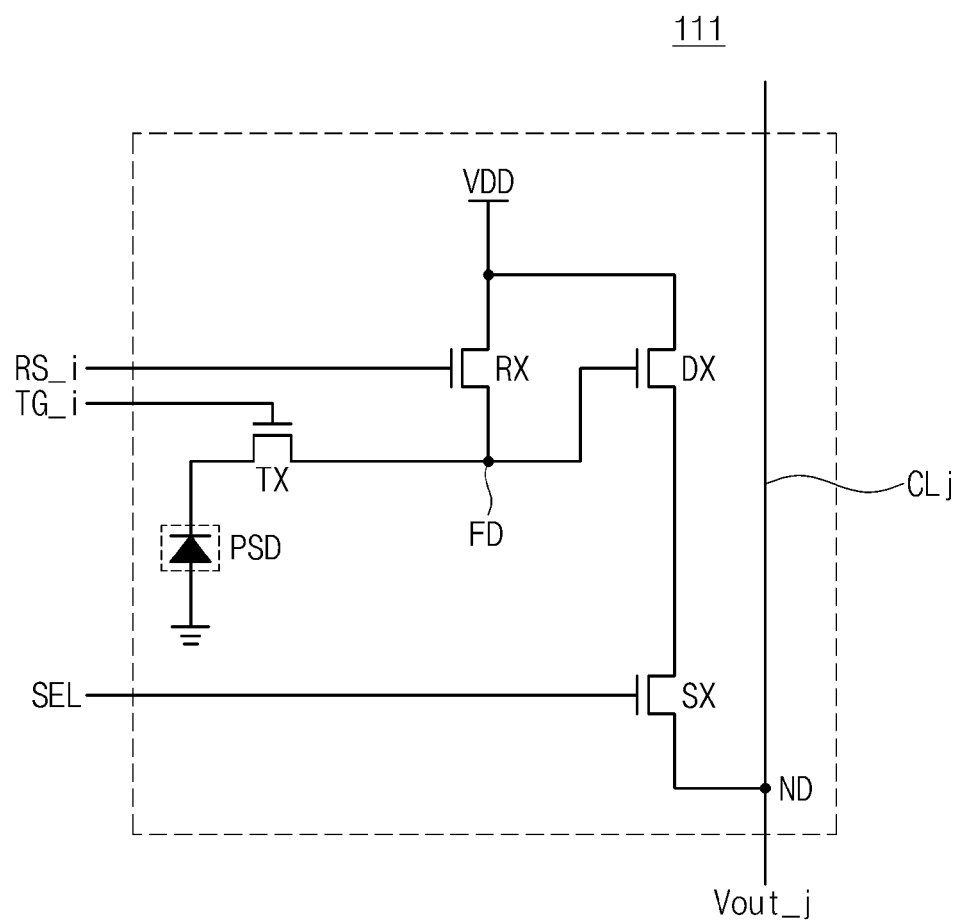
FIG. 3 is a circuit diagram illustrating a pixel sensor PS illustrated in FIG. 2.

FIG. 3 is a circuit diagram illustrating an active pixel sensor APS illustrated in FIG. 2. Referring to FIG. 3, the active pixel sensor 111 can be embodied by a structure including one photoelectric conversion device PSD and four MOS transistors TX, RX, DX, and SX.

The photoelectric conversion device PSD is a photo-sensing device generating and accumulating charges according to the quantity of incident light or incident light intensity. The photoelectric conversion device PSD can be embodied by a photo diode, a photo transistor, a photo gate, a pinned photo diode (PPD), etc.

A transmission transistor TX transmits charges accumulated in the photoelectric conversion device PSD to a floating diffusion region FD. The transmission transistor TX can comprise one transistor which is switched in response to a transmission signal TG_i being provided from the row decoder 120.

The floating diffusion (FD) region has a function of detecting charges corresponding to the quantity of light which enters the floating diffusion (FD) region. The floating diffusion (FD) region accumulates charges being provided from the photoelectric conversion device PSD while the transmission signal TG_i is activated. The floating diffusion region is connected to a gate terminal of a drive transistor DX which is driven as a source follower amplifier. The floating diffusion region may be provided with a power supply voltage VDD from a reset transistor RX.

The reset transistor RX resets the floating diffusion region in response to the reset signal RS_i. A source of the reset transistor RX is connected to the floating diffusion region and a drain of the reset transistor RX is connected to the power supply voltage VDD stage. If the reset transistor RX is turned on by a bias being provided by the reset signal RS_i, the power supply voltage VDD connected to the drain of the reset transistor RX is transmitted to the floating diffusion region. Then charges accumulated in the floating diffusion region are moved to the power supply voltage VDD stage, and a voltage of the floating diffusion region is reset.

The drive transistor DX functions as a source follower amplifier and amplifies a change of an electrical potential of the floating diffusion region to output the amplified change as a sensing voltage Vout_j through an output line.

The select transistor SX selects a pixel sensor to be read by a row unit. The select transistor SX is driven by a select signal SEL being provided by a row unit. If the select transistor SX is turned on, a potential of the floating diffusion region is amplified to be transmitted to a drain of the select transistor SX through the drive transistor DX. The drive signal lines TG_i, RS_i, and SEL of the transmission transistor TX, the reset transistor RX, and the select transistor SX are extended in a horizontal direction so that unit pixels included in a same row are driven at the same time.

Figure 4:
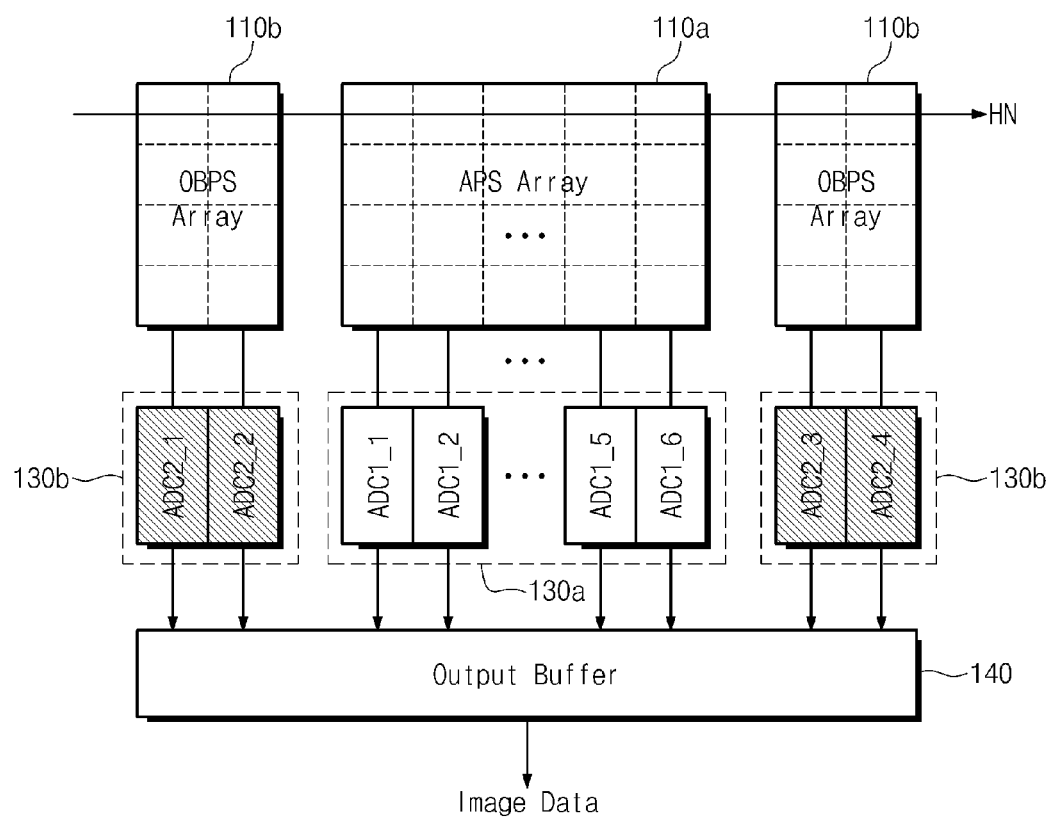
FIG. 4 is a block diagram illustrating an analog to digital converter in accordance with a first embodiment of the inventive concept.

FIG. 4 is a block diagram illustrating an analog to digital converter in accordance with a first embodiment of the inventive concept.

Referring to FIG. 4, an image sensor 100 includes OBPS arrays 110b formed on both sides of an APS array 110a. The image sensor 100 includes a first ADC (ADC1) 130a processing a pixel signal of the APS array 110a and a second ADC (ADC2) 130b processing an optical black signal OB_Pixel of the OBPS array 110b.

ADC circuits ADC1_1~ADC1_6 included in the first ADC (ADC1) 130a and ADC circuits ADC2_1~ADC2_4 included in the second ADC (ADC2) 130b comprise a plurality of heterogeneous ADC circuits. For example, a comparator of the ADC circuits ADC1_1~ADC1_6 included in the first ADC (ADC1) 130a may comprise circuit types which are different from a comparator of the ADC circuits ADC2_1~ADC2_4 included in the second ADC (ADC2) 130b. A counter of the ADC circuits ADC1_1~ADC1_6 included in the first ADC (ADC1) 130a may include counter circuit types which are different from a counter of the ADC circuits ADC2_1~ADC2_4 included in the second ADC (ADC2) 130b.

Each of the ADC circuits ADC1_1~ADC1_6 included in the first ADC (ADC1) 130a may have a same or a similar chip area in comparison to remaining ADC circuits ADC_1~ADC1_6, and may comprise different circuit types from each other. Further, the ADC circuits ADC1_1~ADC1_6 included in the first ADC (ADC1) 130a may have a same circuit type in comparison to remaining ADC circuits ADC1_1~ADC1_6, and may be set by different circuit parameters from each other. By applying a heterogeneous first ADC (ADC1) 130a and second ADC (ADC2) 130b, noise power of a random noise included in a pixel signal Pixel and an optical black signal OB_Pixel which corresponds to one row can be differentiated. Through differentiation of noise power of random noise included in the pixel signal Pixel and the optical black signal OB_Pixel, an effect may occur which reduces horizontal noise HN included in one line.

Figure 5:
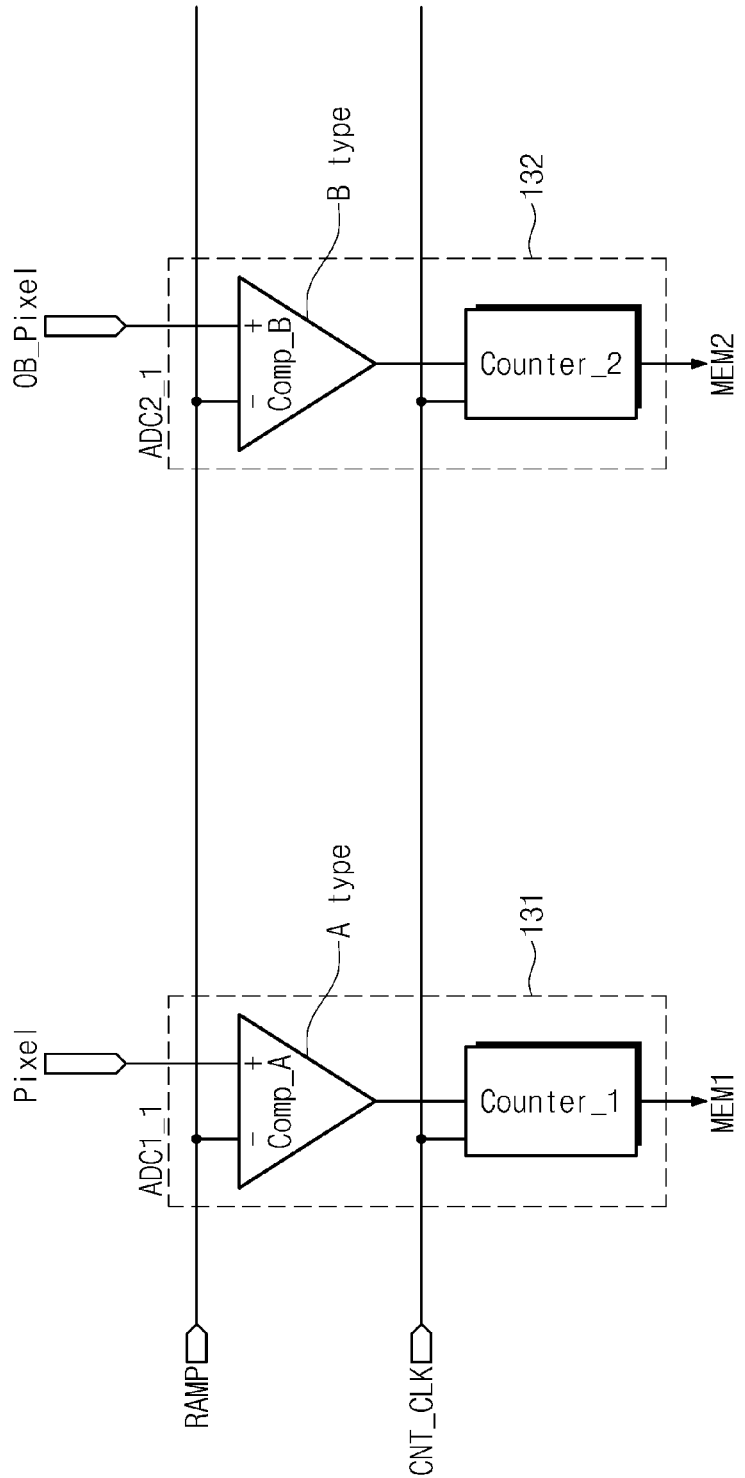
FIG. 5 is a block diagram illustrating a heterogeneous analog to digital converter.

FIG. 5 is a block diagram illustrating the first ADC (ADC1) 103a and the second ADC (ADC2) 103b of FIG. 4. Referring to FIG. 5, any one ADC circuit (ADC_1) 131 included in the first ADC (ADC1) 130a and any one ADC circuit (ADC_2) 132 included in the second ADC (ADC2) 130b are the same, and may include heterogeneous comparators or counters.

The first ADC circuit (ADC_1) 131 included in the first ADC (ADC1) 130a includes a first comparator Comp_A and a first counter Counter_1. The first ADC circuit (ADC_1) 131 converts a pixel signal being provided from the APS array 110a into a digital signal. The first amplifier Comp_A compares a ramp signal RAMP being provided from a ramp generator (not shown) with the pixel signal. The ramp signal has a specific rising slope and a specific falling slope. To perform a comparison operation, the ramp signal is input to a reverse input stage (−) of the first comparator Comp_A and the pixel signal Pixel is input to an input stage (+) of the first comparator Comp_A. The first comparator Comp_A reverses an output level at a time when a level of the ramp signal RAMP becomes higher than a level of the pixel signal Pixel. When an output of the first comparator Comp_A is reversed, the first counter Counter_1 latches a counted value to output the counted value to a first memory MEM1 of the output buffer 140. In other words, the first comparator Comp_A converts a pixel signal Pixel into time axis length information through a comparison operation of the pixel signal Pixel and the ramp signal RAMP. The first comparator Comp_A converts the time axis length information into digital data. The first comparator Comp_A may be replaced with a global counter and a latch circuit.

The second ADC circuit (ADC_2) 132 included in the second ADC (ADC2) 130b includes a second comparator Comp_B and a second counter Counter_2. The second ADC circuit (ADC_2) 132 converts an optical black signal OB_Pixel being provided from the OBPS array 110b into a digital signal. The second amplifier Comp_B compares the ramp signal RAMP with the optical black signal OB_Pixel. The ramp signal is input to a reverse input stage (−) of the second comparator Comp_B and the optical black signal OB_Pixel is input to an input stage (+) of the second comparator Comp_B. A generation method of a digital image signal through a comparison operation of the optical black signal OB_Pixel and the ramp signal RAMP is the same as the operation of the first ADC (ADC1) 130a. Thus, the description of an operation procedure of the second comparator Comp_B and the second counter Counter_2 will be omitted.

However, the first ADC circuit (ADC1) 131 and the first comparator Comp_A included in the first ADC (ADC1) 130a are constituted by different types of circuits than the second ADC circuit (ADC2) 132 and the second comparator Comp_B included in the second ADC (ADC2) 130b. The first ADC (ADC1) 130a and the second ADC (ADC2) 130b may have a same or similar chip area, and may be formed by circuits having different operation characteristics from each other. Through heterogeneous first ADC (ADC1) 130a and second ADC (ADC2) 130b, a random noise level of the pixel signal Pixel and the optical black signal OB_Pixel corresponding to one line can be differentiated. Thus, columns can suppress horizontal noise HN due to a same random noise power.

Figure 6:
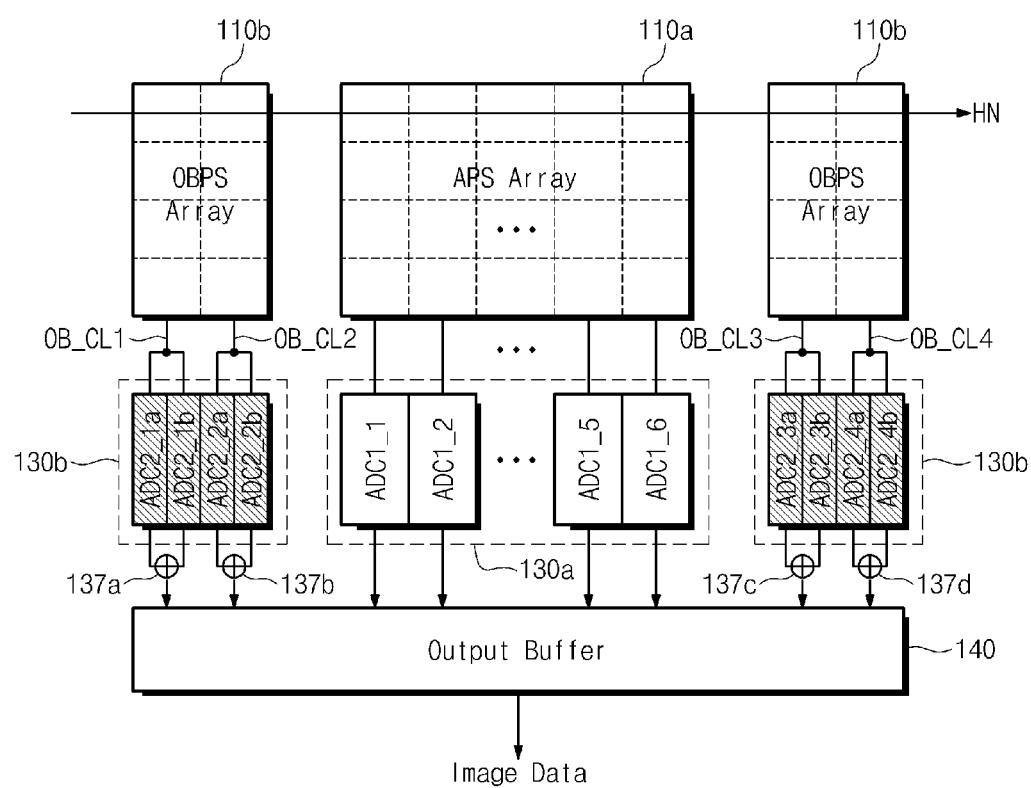
FIG. 6 is a block diagram illustrating an image sensor in accordance with a second embodiment of the inventive concept.

FIG. 6 is a block diagram illustrating an image sensor in accordance with a second embodiment of the inventive concept.

Referring to FIG. 6, an image sensor 100 includes OBPS arrays 110b formed on both sides of an APS array 110a. The image sensor 100 includes a first ADC (ADC1) 130a processing a pixel signal of the APS array 110a and a second ADC (ADC2) 130b processing an optical black signal OB_Pixel of the OBPS array 110b.

ADC circuits ADC1_1~ADC1_6 included in the first ADC (ADC1) 130a and ADC circuits ADC2_1~ADC2_4 included in the second ADC (ADC2) 130b may comprise heterogeneous ADC circuits. For example, each of the ADC circuits ADC1_1~ADC1_6 included in the first ADC (ADC1) 130a is wholly responsible for an analog to digital converting operation with respect to one column. Each of the ADC circuits ADC2_1~ADC2_4 included in the second ADC (ADC2) 130b may include at least two ADC circuits per one column. That is, two or more ADC circuits ADC2_1a and ADC_1b process an optical black signal OB_Pixel corresponding to one column at the same time and may merge the processed result to output it as a digital image signal. The two or more ADC circuits ADC2_1a and ADC_1b may be the same kind, or may have heterogeneous structures. Processing speeds with respect to an optical black signal OB-Pixel being provided of the two or more ADC circuits ADC2_1a and ADC_1b need to be synchronized with each other. Although the two or more ADC circuits ADC2_1a and ADC_1b have heterogeneous structures, they have to be able to output the processed result in the same clock cycle. To standardize a pattern formation in a manufacturing process, it is desirable that the two or more ADC circuits ADC2_1a and ADC_1b are formed by the same structure.

An optical black signal OB_Pixel being provided through one column line CL is provided to ADC circuits ADC2_1a and ADC_1b. Each of the ADC circuits ADC2_1a and ADC_1b converts a level of the optical black signal OB_Pixel into a digital signal. Each of the ADC circuits ADC2_1a and ADC_1b merges the optical black signal OB_Pixel converted into the digital signal using a full adder 137a. The digital signal converted into a column signal by a merging operation of the full adder 137a is transmitted to an output buffer 140. A plurality of ADC circuits processes the optical black signal OB_Pixel corresponding to one column. Therefore, noise power of random noise RN corresponding to the optical black signal OB_Pixel can be differentiated from noise power of the pixel signal Pixel. Thus, horizontal noise HN due to the same noise power can be reduced.

In addition, each of the ADC circuits ADC1_1~ADC1_6 included in the first ADC (ADC1) 130a may have the same structure as the ADC circuits ADC1_1~ADC1_6 of FIG. 4. Each of the ADC circuits ADC1_1~ADC1_6 included in the first ADC (ADC1) 130a may have the same structure as first ADC circuit (ADC_1) 131 of FIG. 5.

Figure 7:
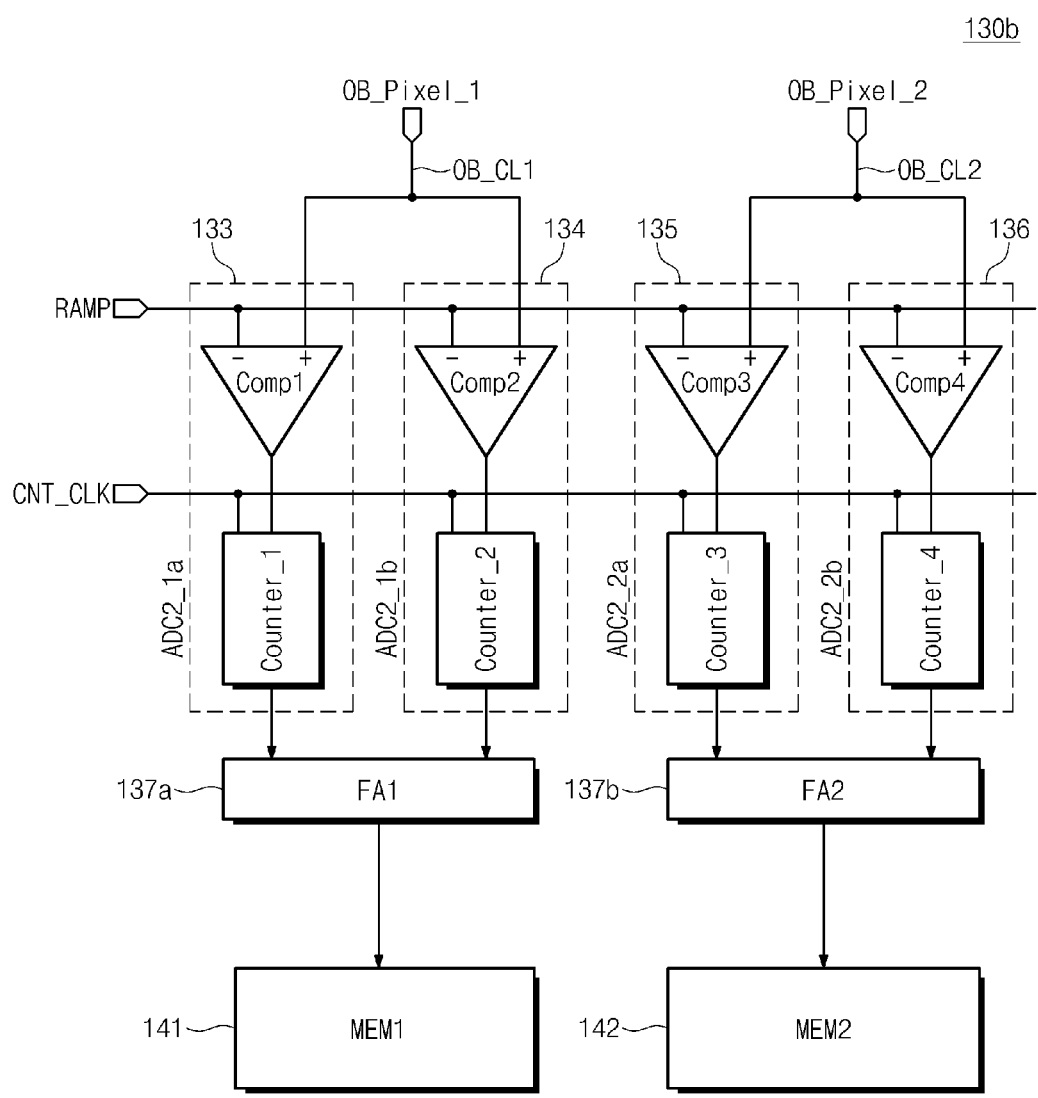
FIG. 7 is a block diagram illustrating the analog to digital converter of FIG. 6.

FIG. 7 is a block diagram illustrating the second ADC (ADC2) 130b of FIG. 6. Referring to FIG. 7, the second ADC (ADC2) 130b may include ADC circuits 133 and 134 corresponding to a first column OB_CL1, ADC circuits 135 and 136 corresponding to a second column OB_CL2, and full adders 137a and 137b.

A first ADC circuit 133 and a second ADC circuit 134 are arranged in parallel in a column line OB_CL1 through which the first optical black signal OB_Pixel is transmitted. The first ADC circuit 133 and the second ADC circuit 134 process the first optical black signal OB_Pixel at the same time. The first ADC circuit 133 and the second ADC circuit 134 illustrate the case that two ADC circuits are included in one column. However, three or more ADC circuits may be included in one column. To include at least two ADC circuits in one column, each chip area of the first ADC circuit 133 and the second ADC circuit 134 should be assigned to be at least half of the ADC circuits ADC1_1~ADC1_6 included in the first ADC (ADC1) 130a. To achieve this, capacitance of input capacitors included in input stages of comparators of the first ADC circuit 133 and the second ADC circuit 134 may be reduced or the input capacitors may be removed.

Through a control of capacitance of the input capacitors, the first ADC circuit 133 and the second ADC circuit 134 may have the same circuit structure as the ADC circuits ADC1_1~ADC1_6 included in the first ADC (ADC1) 130a or may have a different operation characteristic from the ADC circuits ADC1_1~ADC1_6 included in the first ADC (ADC1) 130a. That at least two ADC circuits are included in one column can be achieved by not only controlling capacitance of the input capacitors but also changing structures of the comparators Comp1 and Comp2.

A first optical black signal OB_Pixel_1 is provided to a first column OB_CL1. Then the first optical black signal OB_Pixel_1 is input to the first ADC circuit 133 and the second ADC circuit 134 at the same time. The comparators Comp1 and Comp2 of the first ADC circuit 133 and the second ADC circuit 134 compare the first optical black signal OB_Pixel_1 with a ramp signal RAMP at the same time. The comparators Comp1 and Comp2 convert the first optical black signal OB_Pixel_1 into time axis length information through the comparison operation. Counters Counter_1 and Counter_2 convert the length information into a digital signal with reference to a count clock CNT_CLK.

The first optical black signal OB_Pixel_1 which is converted into two digital signals by a parallel processing method is merged by the first full adder 137a. That is, two image data processed in parallel by the first full adder 137a are merged into image data corresponding to one column. The image data processed by the first full adder 137a is stored in a first memory 141 included in the output buffer 140.

A second optical black signal OB_Pixel_1 being provided to a second column OB_CL2 is processed in parallel by the third ADC circuit 135 and the fourth ADC circuit 136. Signals converted into digital signals in parallel are merged by a second full adder 137b and are stored in a second memory 142.

Horizontal noise HN corresponding to one row is caused by random noise RNPIX of a pixel sensor and random noise RNADC of ADC. To reduce horizontal noise HN, it is necessary to reduce random noise RNPIX of a pixel sensor or random noise RNADC of ADC. Qualitative analysis of horizontal noise HN will be described through mathematical formulas 1 through 3 below.

When the number of total columns is N, amplitude of horizontal noise of an image sensor having random noise RN can be expressed by a mathematical formula 1.

$$HN = \frac{RN}{\sqrt{N}} \quad \text{[mathematical formula 1]}$$

Amplitude of random noise RN in a pixel and an ADC corresponding to the number (M) of ADC circuits included in one optical black column can be expressed by a mathematical formula 2.

$$RN = \sqrt{RN_{pix}^2 + \frac{RN_{ADC}^2}{M}} \quad \text{[mathematical formula 2]}$$

Herein, $RN_{pix}$ means random noise in a pixel sensor and $RN_{ADC}$ means random noise in an ADC. If the mathematical formula 2 is substituted into the mathematical formula 1, amplitude of horizontal noise in accordance with exemplary embodiments of the inventive concept can be expressed by a mathematical formula 3.

$$HN = \sqrt{HN_{pix}^2 + \frac{RN_{ADC}^2}{MN}} \quad \text{[mathematical formula 3]}$$

According to the mathematical formula 3, amplitude of horizontal noise HN corresponding to one line may be reduced according to multiple (M) of an ADC circuit corresponding to an optical black column. According to the second embodiment of the inventive concept, as multiple (M) of ADC circuits included in each of the optical black columns increases, noise power of horizontal noise HN is reduced.

Figure 8:
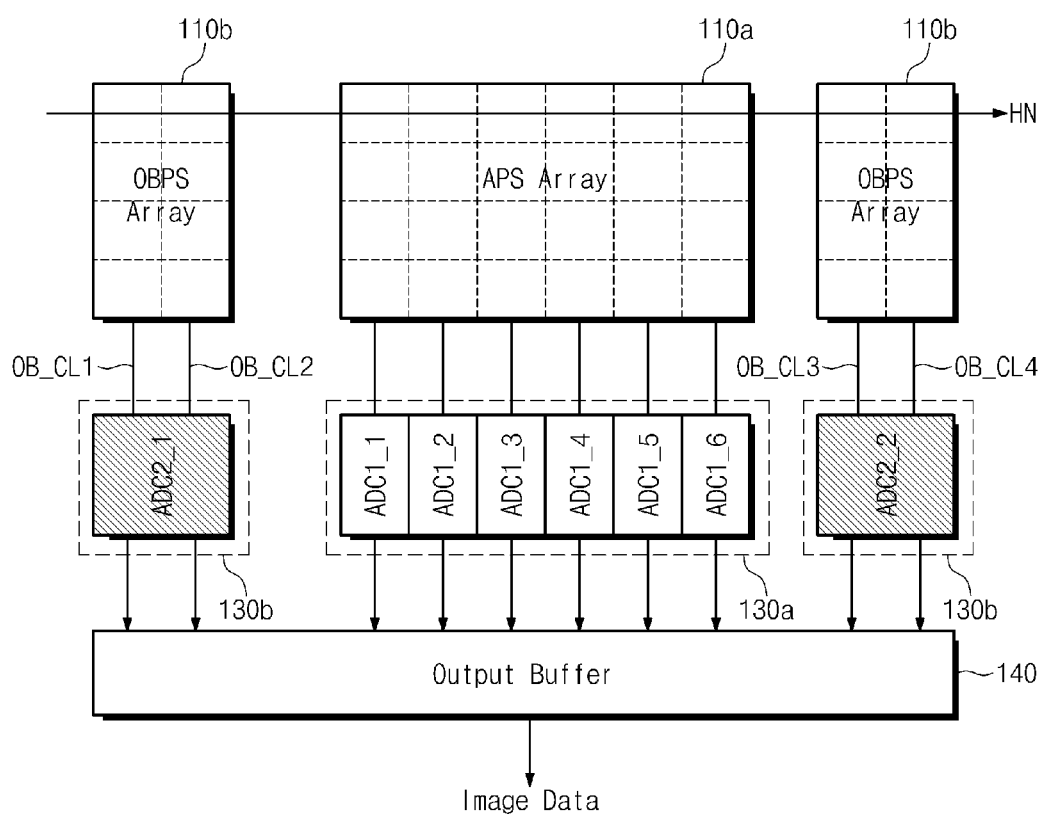
FIG. 8 is a block diagram illustrating an analog to digital converter in accordance with a third embodiment of the inventive concept.

FIG. 8 is a block diagram illustrating an image sensor in accordance with a third embodiment of the inventive concept. Referring to FIG. 8, an image sensor 100 includes OBPS arrays 110b formed on both sides of an APS array 110a. The image sensor 100 includes a first ADC (ADC1) 130a processing a pixel signal of the APS array 110a and a second ADC (ADC2) 130b processing an optical black signal OB_Pixel of the OBPS array 110b.

ADC circuits ADC1_1~ADC1_6 included in the first ADC (ADC1) 130a and ADC circuits ADC2_1~ADC2_2 included in the second ADC (ADC2) 130b may comprise heterogeneous ADC circuits. For example, in the ADC circuits ADC2_1~ADC2_2 included in the second ADC (ADC2) 130b, a plurality of columns is assigned to one ADC circuit. That is, one ADC circuit ADC2_1 can process optical black signals OB_Pixel corresponding to at least two columns OB_CL1 and OB_CL2.

The optical black signals OB_Pixel being provided through the two columns OB_CL1 and OB_CL2 from the OBPS array 110b can be processed by one ADC circuit ADC2_1. Similarly, optical black signals OB_Pixel being provided through two columns OB_CL3 and OB_CL4 from the OBPS array 110b can be processed by one ADC circuit ADC2_2. The ADC circuits ADC1_1~ADC1_6 are assigned to respective columns of the APS array 110a.

The ADC circuit ADC2_1 can sequentially process an optical black signal OB_Pixel being provided through at least two columns OB_CL1 and OB_CL2 to sequentially or concurrently provide the processed optical black signal OB_Pixel to an output buffer 140. That is, the ADC circuit ADC2_1 has to be able to process an optical black signal OB_Pixel being provided through at least two columns OB_CL1 and OB_CL2 and has to have a high noise characteristic. The ADC circuit ADC2_2 is formed to have the same constitution and noise characteristic as the ADC circuit ADC2_1.

Figure 9:
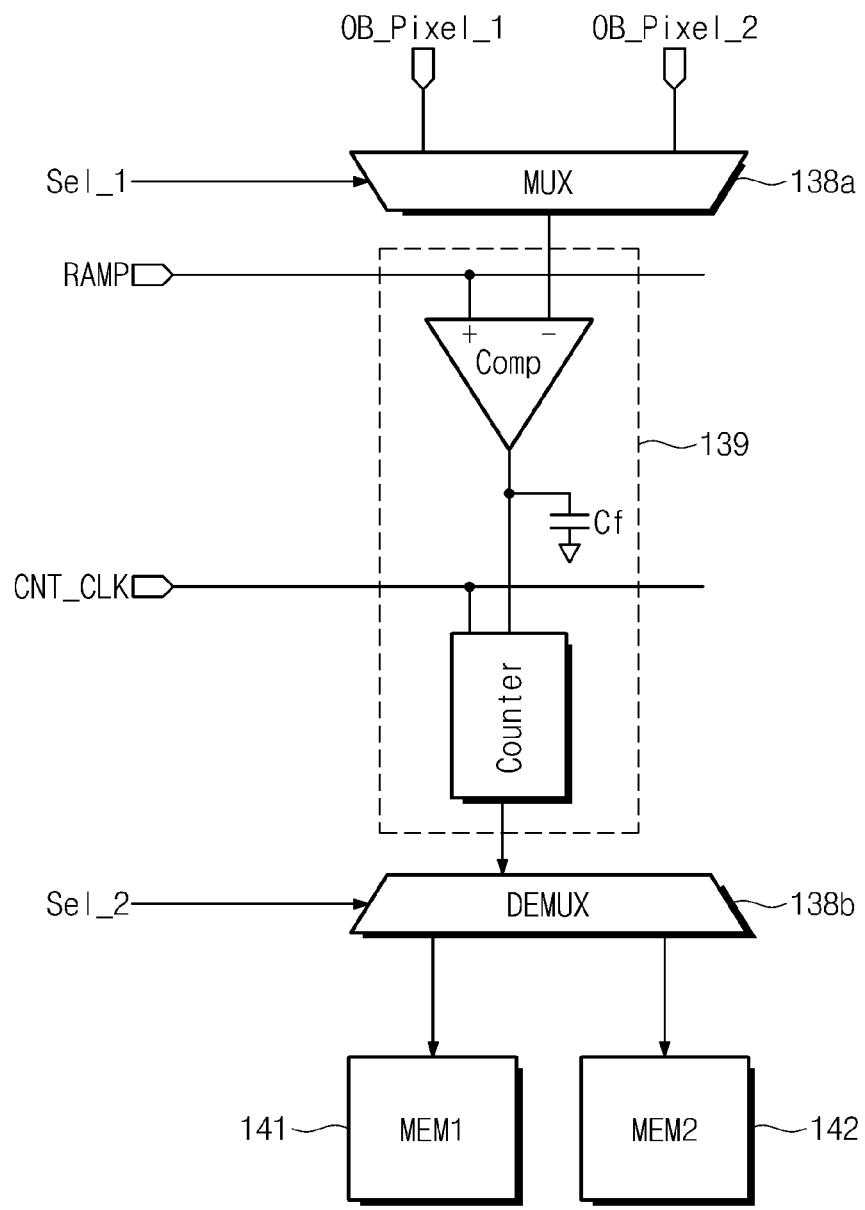
FIG. 9 is a block diagram illustrating the analog to digital converter of an optical black region.

FIG. 9 is a block diagram illustrating the second ADC (ADC2) 130b of FIG. 8. Referring to FIG. 9, in the second ADC (ADC2) 130b, one ADC circuit 139 processes optical black signals OB_Pixel_1 and OB_Pixel_2 corresponding to the first column OB_CL1 and the second column OB_CL2 respectively. To achieve this, a multiplexer 138a and a demultiplexer 138b may be provided in an input stage and output stage of the ADC circuit 139.

The multiplexer 138a can select any one of the optical black signals OB_Pixel_1 and OB_Pixel_2 according to a select signal Sel_1. The select signal Sel_1 may be generated from a timing controller 150.

The ADC circuit 139 processes any one signal selected from the optical black signals OB_Pixel_1 and OB_Pixel_2. That is, a comparator compares the selected optical black signal with a ramp signal RAMP to convert it into time axis length information. A counter converts the time axis length information into a digital signal with reference to a count clock CNT_CLK. The ADC circuit 139 sequentially performs that operation on each of the optical black signals OB_Pixel_1 and OB_Pixel_2.

The demultiplexer 138b selects a digital signal corresponding to each of the optical black signals OB_Pixel_1 and OB_Pixel_2 to transmit the selected digital signal to a first memory 141 or a second memory 142. A selection of the demultiplexer 138b is performed by a select signal Sel_2.

An embodiment that the optical black signals OB_Pixel_1 and OB_Pixel_2 being provided to the first column OB_CL1 and the second column OB_CL2 are processed by one ADC circuit 139 was described. Herein, although a structure that two optical black columns are shared by the one ADC circuit 139 was described but the inventive concept is not limited thereto. That is, two or more optical black columns may be shared by one ADC circuit.

One ADC circuit shared by optical black columns may have a high noise characteristic. For example, the ADC circuit 139 may have a high cut off characteristic with respect to random noise RN of a high frequency region. That is, random noise RN due to the ADC circuit 139 has to be minimized with respect to the optical black column. To have a high noise cut off characteristic, the ADC circuit 139 may include a high-capacity capacitor for a low pass filtering being provided at an output stage of the comparator Comp. Although not illustrated in the drawing, a size of an input capacitor being provided at an input stage of the comparator may be increased. By applying various filtering technologies, random noise power of the ADC circuit 139 can be minimized. As capacitance of the capacitor increases, a chip area occupied by the ADC circuit 139 may be increased. However, an occupied area of the ADC circuit 139 can be allowed to be two times the ADC circuit ADC1_1 included in the first ADC (ADC1) 130a.

Figure 10:
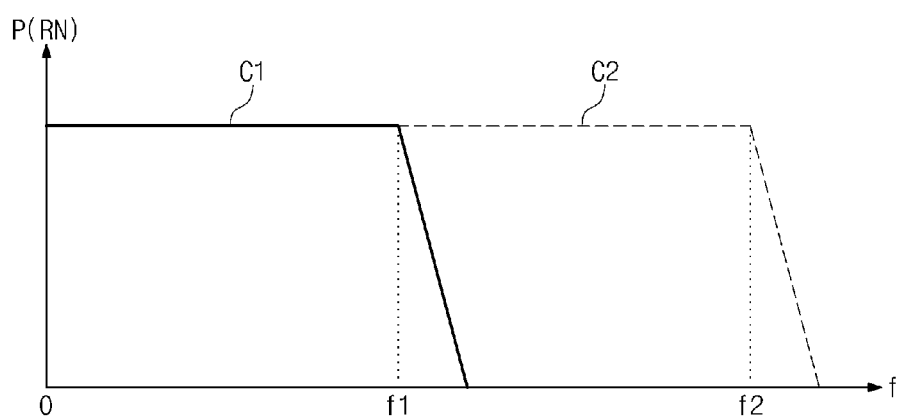
FIG. 10 is a drawing illustrating a filtering effect of the analog to digital converter of FIG. 9.

FIG. 10 is a drawing illustrating a filtering effect of the ADC circuit of FIG. 9. Referring to FIG. 10, a noise band of random noise RN can be reduced by providing a filtering capacitor in an input or output stage of the ADC circuit 139.

A curve C1 shows a noise band of the ADC circuit 139 processing optical black signals OB_Pixel_1 and OB_Pixel_2 being provided from a plurality of optical black column OB_CL1 and OB_CL2. A curve C2 shows a noise band of the ADC circuit ADC_1 included in the first ADC (ADC1) 130a processing a pixel signal Pixel of the APS array 110a of FIG. 8.

A noise band of the ADC circuit 139 can be reduced to f1 by adding various constitutions for a noise characteristic improvement. Noise power in frequencies greater than the f1 can be suppressed by an input capacitor (not shown) formed in an input stage of the comparator Comp or an output capacitor Cf formed in an output stage of the comparator Comp. A noise band size of the ADC circuit 139 can be determined by capacitance of the input capacitor formed in an input stage of the comparator Comp or the output capacitor Cf formed in an output stage of the comparator Comp.

A noise band of the ADC circuit ADC_1 included in the first ADC (ADC1) 130a not including sufficient constituents for a noise characteristic improvement maintains f2. That is, a noise band of random noise RN of the ADC circuit ADC_1 has a noise characteristic formed by the curves C1 and C2.

According to a noise characteristic of the ADC circuit 139 illustrated in FIG. 10, the ADC circuit 139 has to be constituted to have a higher noise characteristic than the ADC circuit ADC_1. The ADC circuit 139 can process signals OB_Pixel_1 and OB_Pixel_2 of at least two optical black columns OB_CL1 and OB_CL2 because it can be assigned with a chip occupied area two times the ADC circuit ADC_1.

Figure 11:
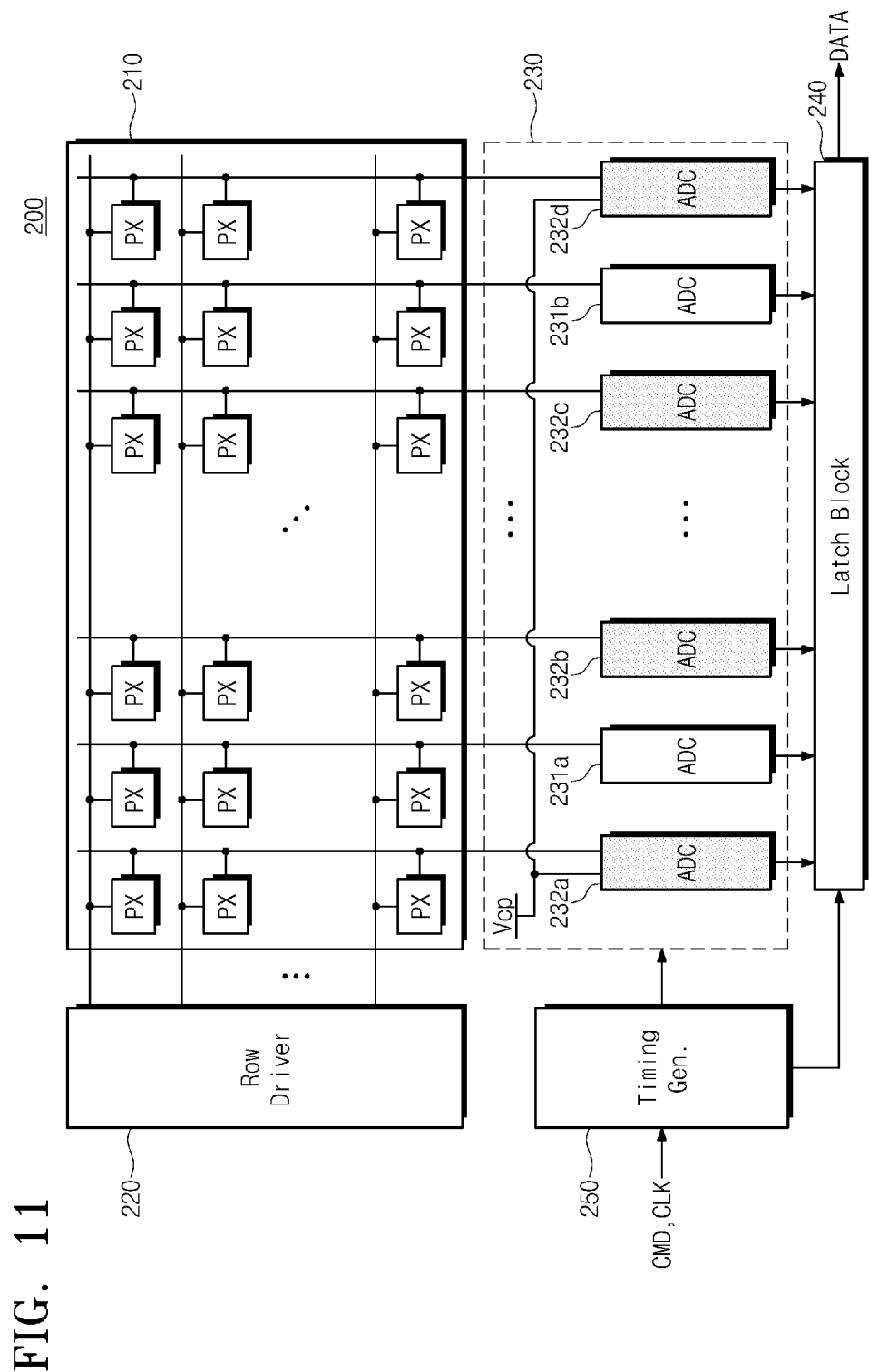
FIG. 11 is a block diagram illustrating an image sensor in accordance with an embodiment of the inventive concept.

FIG. 11 is a block diagram illustrating an image sensor in accordance with another exemplary embodiment of the inventive concept. Referring to FIG. 11, an image sensor 200 includes a pixel sensor array 210, a row driver 220, an analog to digital converter 230, a latch block 240, and a timing generator 250.

The pixel sensor array 210 includes a plurality of pixels PX arranged in a matrix form. Each of the pixels PX may include a red pixel converting light of a red spectral region into an electrical signal, a blue pixel converting light of a blue spectral region into an electrical signal, and a green pixel converting light of a green spectral region into an electrical signal. The pixels PX may include an optical black pixel.

A unit pixel PX includes a light sensing device performing a photoelectric conversion and multiple transistors. The light sensing device can be embodied by a photodiode or a phototransistor.

The row driver 220 can generates multiple control signals for controlling a photo sensing operation of each of the pixels PX under the control of the timing generator 250. The row driver 220 can drive pixels by a row unit.

The analog to digital converter 230 includes a plurality of ADC circuits ADCs corresponding to at least one column of the pixel sensor array 210. The analog to digital converter 230 converts a light sensing signal of an analog form being output from the pixel sensor array 210 into a digital signal. The analog to digital converter 230 can perform a correlate double sampling (CDS) on each of light sensing signals being output from the pixel sensor array 210.

The analog to digital converter 230 may include a plurality of first ADC circuits 231a and 231b and a plurality of second ADC circuits 232a, 232b and 232c that differently operate according to an operation mode. When a first operation mode and a second operation mode are performed, the first ADC circuits 231a and 231b convert an output signal of the pixel sensor array 210 into a digital signal to output the converted signal. When the first operation mode is performed, the second ADC circuits 232a, 232b and 232c convert an output signal of the pixel sensor array 210 into a digital signal to output the converted signal. When the second operation mode is performed, the second ADC circuits 232a, 232b and 232c convert a compensating input signal instead of the output signal of the pixel sensor array 210 into a digital signal to output the converted signal. In FIG. 11, for explanation purposes, the first ADC circuits 231*a* and 231*b* and the second ADC circuits 232*a*, 232*b* and 232*c* are divided to be illustrated. However, the first ADC circuits 231*a* and 231*b* and the second ADC circuits 232*a*, 232*b* and 232*c* are not physically divided. According to an operation mode of the image sensor 200, a part of ADC circuits may be selected to be the first ADC circuits 231*a* and 231*b* and the other part of ADC circuits may be selected to be the second ADC circuits 232*a*, 232*b* and 232*c*. The selections may be variously changed.

When the first operation mode is performed, the ADC circuits convert a signal being output from the pixel sensor array 210 into a digital signal to output the converted signal. When the second operation mode is performed, a part of the ADC circuits, that is, the first ADC circuits 231*a* and 231*b* convert a signal being output from the pixel sensor array 210 into a digital signal to output the converted signal as a light sensing signal and the second ADC circuits 232*a*, 232*b* and 232*c* convert a compensating input signal Vcp into a digital signal to output the converted signal. For example, the compensating input signal Vcp may be a DC voltage. For another example, the compensating input signal Vcp may be a ground voltage.

The first operation mode is that all pixels PX included in each row of the pixel sensor array 210 sense light. The first operation mode may include a high image quality, a static image mode, etc. Since the first operation mode uses all the pixels PX included in each row, it may be called a full sampling mode.

The second operation mode is that a part of pixels PX included in each row of the pixel sensor array 210 senses light. The second operation mode may include a low image quality, a moving image mode, a crop mode, etc. Since the second operation mode uses a part of the pixels PX included in each row, it may be called a sub sampling mode.

In the first operation mode, an analog light sensing signal is output from all column lines included in the pixel sensor array 210. Thus, all the ADC circuits are used to convert the analog light sensing signal into a digital signal.

However, in the second operation mode, since a part of the column lines included in the pixel sensor array 210 outputs a light sensing signal, a part of the ADC circuit is used and the remaining ADC circuits do not operate. At this time, the image sensor 200 uses a part of the ADC circuits not used to convert the analog light sensing signal, for instance, the second ADC circuits 232*a*, 232*b* and 232*c* to compensate horizontal noise.

Noise being generated from the image sensor 200 may include random noise and horizontal noise. The random noise is generated by deviation of a light sensing signal corresponding to each pixel and the horizontal noise is generated by deviation by rows of a light sensing signal. For instance, if a difference occurs between a drive voltage when driving first row pixels and a drive voltage when driving second row pixels, the difference may be recognized as noise. The horizontal noise may be generated by a difference of a power supply voltage being applied to each row of the pixel sensor array 210, a characteristic difference of pixels of each row and changes of voltages being used when converting analog light sensing signal output from the pixel sensor array 210 into a digital signal. To compensate the horizontal noise HN, a method is used that optical black pixel OP is provided on one side or both sides of active pixels AP in each row of the pixel sensor array 210 and a value of the active pixel AP is compensated using an optical black signal being output from the ADC circuit corresponding to the optical black pixel OP. That is, a light sensing signal sensed in the active pixel AP is compensated using the optical black signal as a noise compensation signal. At this time, a reduction width of the horizontal noise is affected by the number of the optical black pixels OP included in each row or the number of the ADC circuits corresponding to the optical black pixel OP. That is, since as the number of noise compensation signal increases, a reduction width of the horizontal noise becomes great, as the number of the optical black pixels OP or the number of the ADC circuits corresponding to the optical black pixel OP increases, the horizontal noise may be reduced. However, if the number of the optical black pixels OP or the number of the ADC circuits corresponding to the optical black pixel OP increases to reduce the horizontal noise, an area of the image sensor 200 increases. According to exemplary embodiments of the inventive concept, without an increase of the number of the optical black pixels OP or the ADC circuits, in the second mode, for instance, in a low image quality, a plurality of ADC circuits not being used to sense light generates a noise compensating signal. Therefore, horizontal noise can be reduced without an increase of the image sensor 200.

Referring to FIG. 11, the latch block 240 stores a signal being output from the analog to digital converter 230 and sequentially outputs the stored signals under the control of the timing generator 250.

The timing generator 250 receives a command signal CMD, a clock signal CLK, etc., and outputs control signals for controlling operations of the row driver 220, the analog to digital converter 230 and the latch block 240.

Figure 12A:
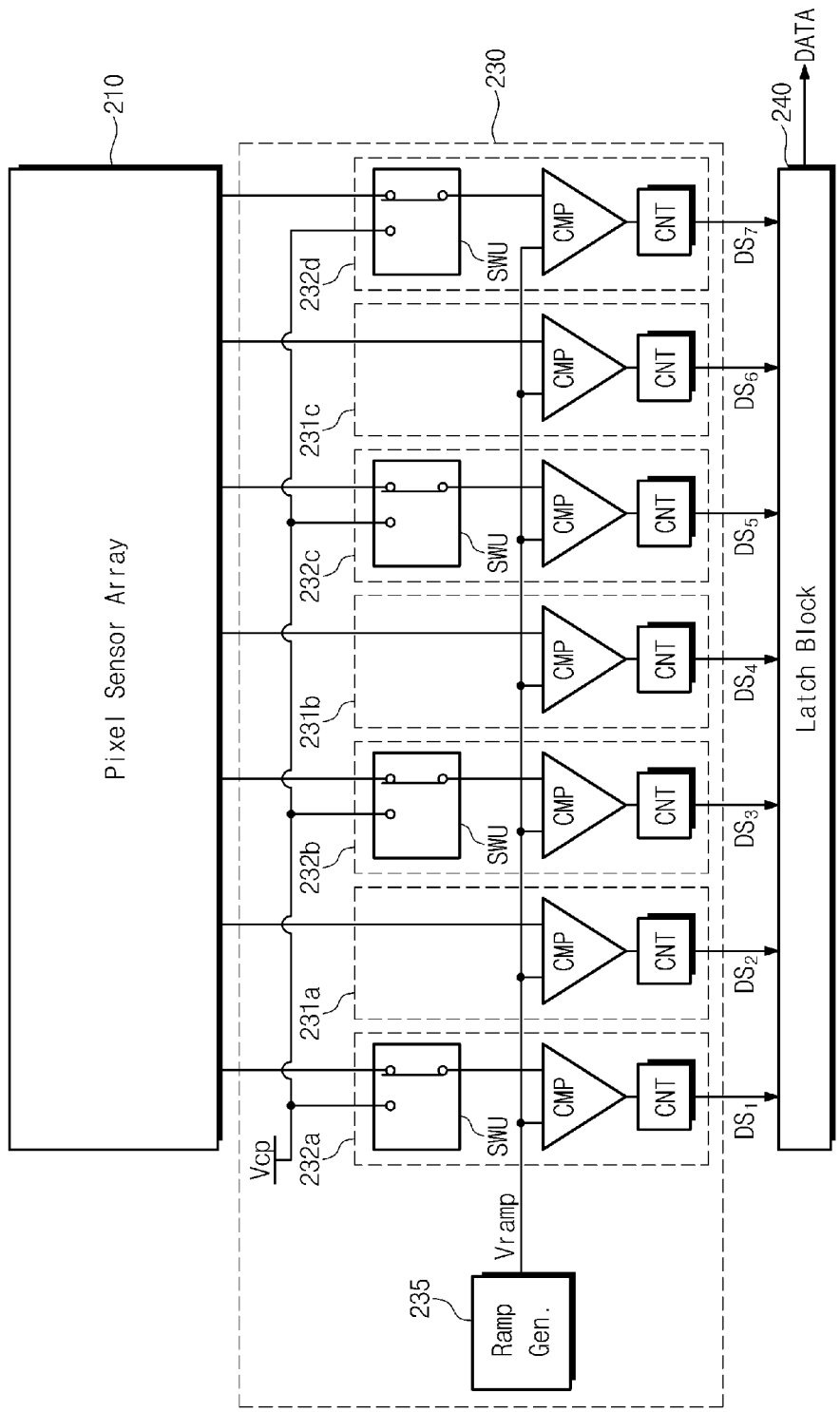
FIGS. 12A and 12B are drawings for illustrating an operation of the image sensor of FIG. 11 according to an operation mode.
Figure 12B:
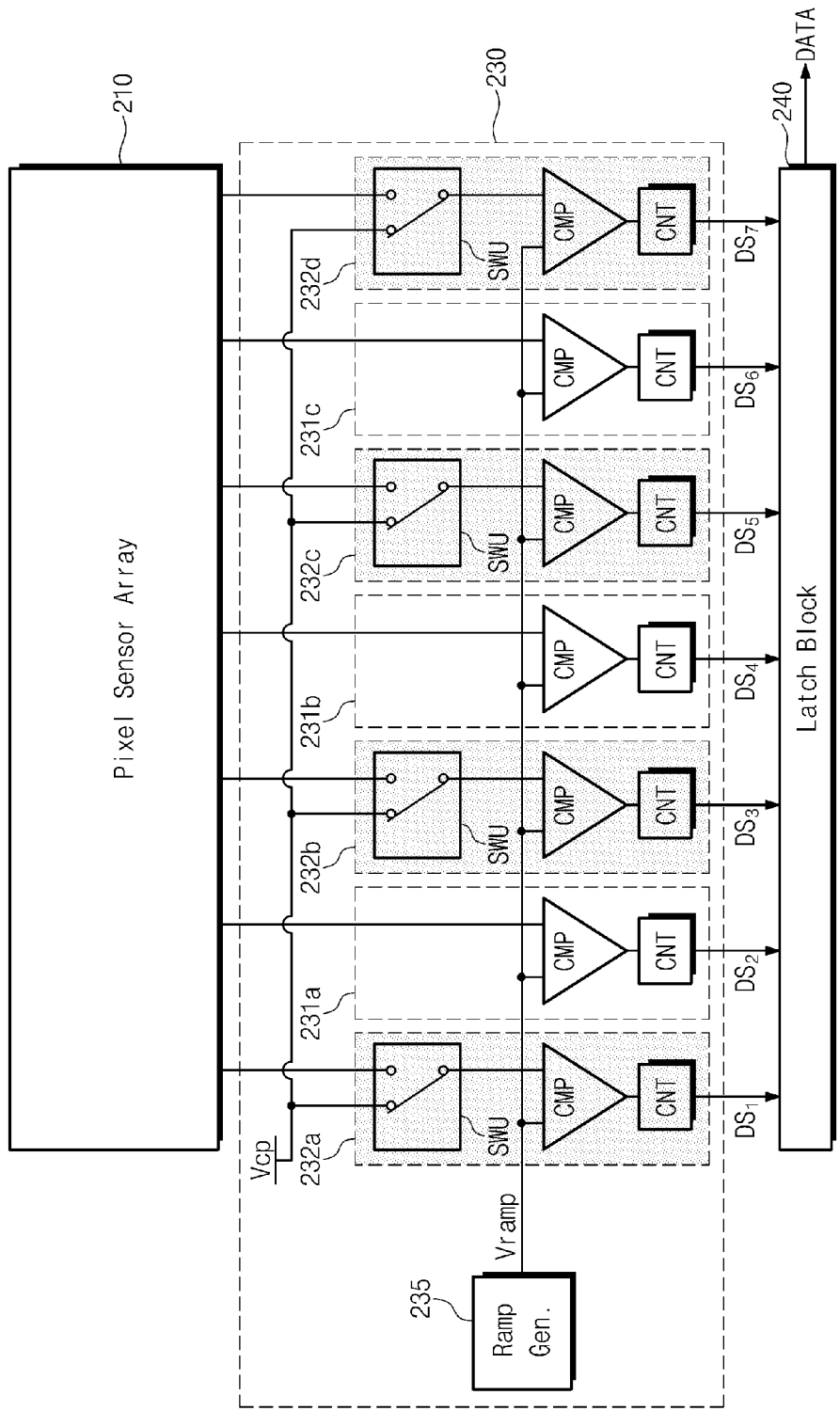

FIGS. 12A and 12B are drawings illustrating an operation of the analog to digital converter 230 of FIG. 11 by an operation mode of the image sensor 200. FIG. 12A is a drawing illustrating the analog to digital converter 230 in a first operation mode, and FIG. 12B is a drawing illustrating the analog to digital converter 230 in a second operation mode Referring to FIGS. 12A and 12B, the analog to digital converter 230 may include a plurality of ADC circuits 231*a*~231*c* and 232*a*~232*d* and a ramp signal generator 235 connected to at least one column line of the pixel sensor array 210. In FIGS. 12A and 12B, the ramp signal generator 235 is disposed inside the analog to digital converter 230 but the ramp signal generator 235 may be disposed outside the analog to digital converter 230.

The ADC circuits 231*a*~231*c* and 232*a*~232*d* include a plurality of first ADC circuits (ADC1) 231*a*~231*c* and a plurality of second ADC circuits (ADC2) 232*a*~232*d*. In FIGS. 12A and 12B, the number of the first ADC circuits (ADC1) 231*a*~231*c* is three and the number of the second ADC circuits (ADC2) 232*a*~232*d* is four. However, the number is not limited to this example. For example, the number of the first ADC circuits (ADC1) 231*a*~231*c* may be three and the number of the second ADC circuits (ADC2) 232*a*~232*d* may be variously changed.

Each of the first ADC circuits (ADC1) 231*a*-231*c* may include a comparator CMP and a counter CNT. Each of the second ADC circuits (ADC2) 232*a*-232*d* may include a switching unit SWU, a comparator CMP, and a counter CNT. The switching unit SWU can select one of a signal being output from the pixel sensor array 210 and a compensating input signal Vcp. Each of the switching units SWU can control an output of the second ADC circuits (ADC2) 232*a*-232*d* according to an operation mode of the image sensor 200. The first ADC circuits (ADC1) 231*a*-231*c* do not include the switching unit SWU and always output a signal being output from the pixel sensor array 210 regardless of an operation mode of the image sensor 200.

The comparator CMP compares an input signal selected by the switching unit SWU with a ramp signal output from the ramp signal generator 235 to output the comparison result. The comparator CMP can output one of a first level signal, for instance, logic high and a second level signal, for instance, logic low as the comparison result. The counter CNT counts the number of the first level signals or the second level signals which are of the same kind among signals output from the comparator CMP in synchronization with a count clock signal (not shown). Thus, an analog signal can be converted into a digital signal and the converted signal can be output.

Referring to FIG. 12A, in the first operation mode, the switching unit SWU included in each of the second ADC circuits (ADC2) 232a-232d selects a signal output from the pixel sensor array 210 to provide the selected signal to the comparator CMP. The first ADC circuits (ADC1) 231a-231c select a signal output from the pixel sensor array 210 to provide the selected signal to the comparator CMP. Accordingly, the first ADC circuits (ADC1) 231a-231c and the second ADC circuits (ADC2) 232a-232d can convert an analog signal output from the pixel sensor array 210 into a digital signal to output the converted digital signal.

Referring to FIG. 12B, in the second operation mode, the first ADC circuits (ADC1) 231a-231c select a signal output from the pixel sensor array 210 to provide the selected signal to the comparator CMP while the switching unit SWU included in each of the second ADC circuits (ADC2) 232a-232d selects a compensating input signal Vcp to provide the selected compensating input signal Vcp to the comparator CMP. Accordingly, the first ADC circuits (ADC1) 231a-231c convert an analog signal output from the pixel sensor array 210 into a digital signal to output the converted digital signal. The second ADC circuits (ADC2) 232a-232d convert the compensating input signal Vcp into a digital signal to output the converted digital signal. Output signals DS2, DS4 and DS6 of the first ADC circuits (ADC1) 231a-231c are a light sensing signal and output signals DS1, DS3, DS5, and DS7 are a noise compensation signal. The output signals can be used to compensate noise of the light sensing signal.

The latch block 240 can temporarily store a plurality of signals DS1-DS7 being output from the analog to digital converter 230 and then sequentially output the stored signals DS1-DS7 to a signal compensating unit (not shown) disposed inside or outside the image sensor 200. To effectively process noise compensation, the latch block 240 can make the order of signals output according to an operation mode different.

Figure 13A:
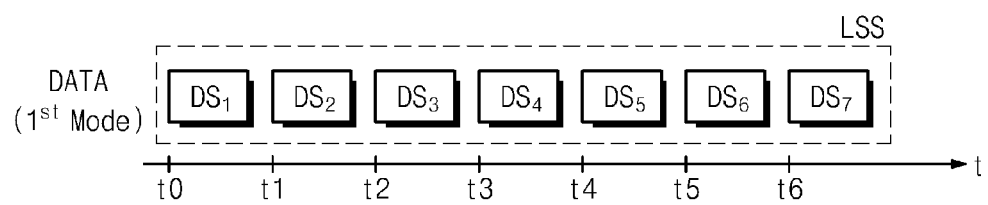
FIGS. 13A and 13B are drawings for illustrating the order of data being output from a latch block of FIG. 11 according to an operation mode.
Figure 13B:
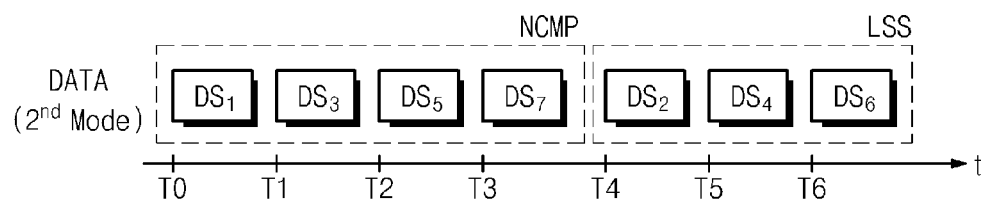

FIGS. 13A and 13B are drawings for illustrating the order of data being output from a latch block of FIG. 11 according to an operation mode. Referring to FIGS. 13A and 13B, signals DS1-DS7 generated from the ADC circuits 231a-231c and 232a-232d can be sequentially output in time. Referring to FIG. 13A, in a first operation mode, the signals DS1-DS7 generated from the ADC circuits 231a-231c and 232a-232d are output as a light sensing signal LSS which begins with the signal DS1 and are sequentially output in the order of arrangement of the ADC circuits 231a-231c and 232a-232d. A time order is t0<t1<t2< . . . <tn. That is, left signals in the drawing are output first.

Referring to FIG. 13B, in a second operation mode, after signals DS1, DS3, DS5, and DS7 generated from the second ADC circuits (ADC2) 232a-232d are output as a noise compensating signal which begins with the signal DS1, signals DS2, DS4 and DS6 generated from the first ADC circuits (ADC1) 231a-231c can be output as a light sensing signal which begins with the signal DS2. If the noise compensation signals DS1, DS3, DS5 and DS7 are output prior to the light sensing signals DS2, DS4 and DS6. Therefore, a compensation reference signal of a signal compensating unit (not shown) is generated, a noise compensation with respect to each of the light sensing signals DS2, DS4 and DS6 being sequentially output can be smoothly performed. Accordingly, an excessive use of resources of the signal compensating unit, for instance, a signal storage area can be prevented. Herein, the time order is T0<T1<T2< . . . <Tn. That is, left signals illustrated in the drawing are output first.

Figure 14:
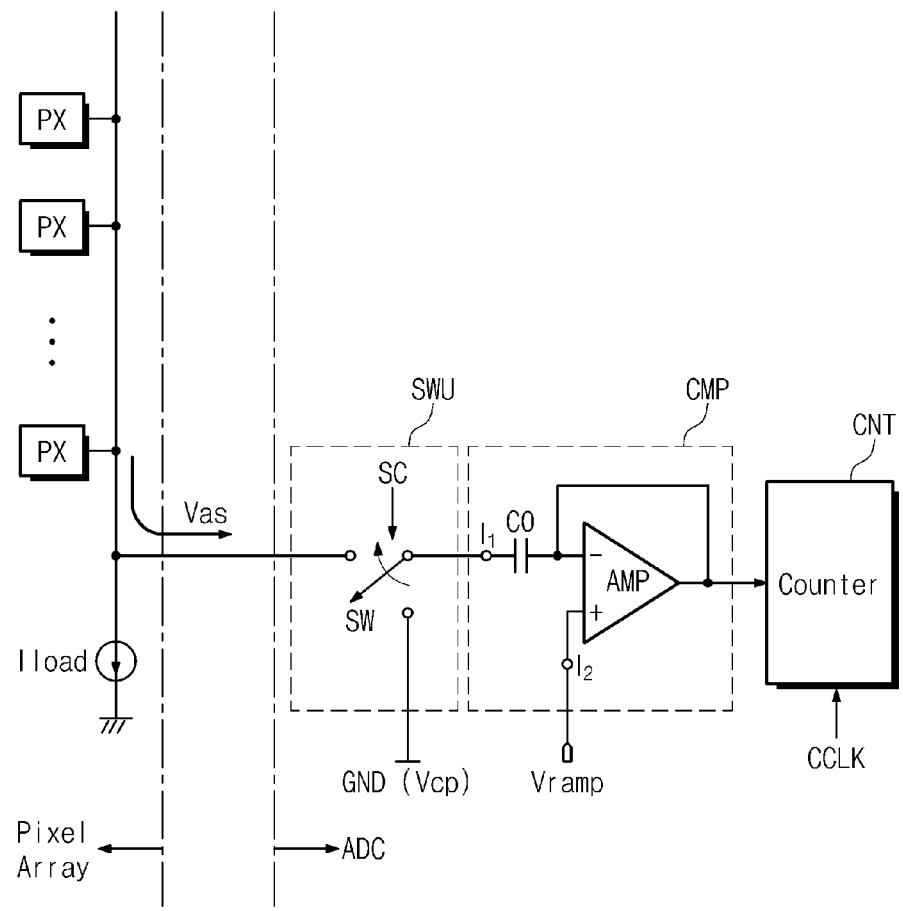
FIG. 14 is a drawing for illustrating a column line of a pixel array of FIG. 11 and constitution and operation of a second ADC circuit corresponding to the column line.

FIG. 14 is a drawing for illustrating a column line of a pixel array of FIG. 11 and constitution and operation of a second ADC circuit corresponding to the column line.

Referring to FIG. 14, a plurality of pixels PX is connected to one column line of the pixel sensor array 210. As described in FIG. 3, since an output part (Dx of FIG. 3) of the pixel PX is a source follower type, I load which is a source load is connected to a column line. An analog sensing signal Vas may be output from a pixel PX selected from a plurality of pixels PX.

A switching unit SWU includes a switch SW that operates in response to a switching control signal SC. The switch SW can be embodied by an NMOSFET, a PMOSFET, or a transmission gate. One end of the switch SW may be connected to a first input terminal $I_1$ of a comparator CMP. The other end of the switch SW may be connected to the column line compensating input signal Vcp in response to a switching control signal SC. In this case, the compensating input signal Vcp may be a ground voltage GND. The switch SW can provide the analog sensing signal Vas or the compensating input signal Vcp to the first input terminal $I_1$ of the comparator CMP in response to the switching control signal SC.

The comparator CMP includes an amplifier AMP and a capacitor C0. The comparator CMP may further include switches and capacitors for controlling an input and an output. In FIG. 14, the comparator CMP is embodied by a differential amplifier AMP. However, the inventive concept is not limited to this example. The comparator CMP may be embodied by an operational transconductance amplifier (OTA), an inverter, etc. The analog sensing signal Vsa or the compensating input signal Vcp may be input to the first input terminal $I_1$ of the comparator CMP according to selection of the switching unit SWU. A ramp signal Vramp is input to a second input terminal $I_2$ of the comparator CMP.

The comparator CMP compares two input signals being input to the first and second input terminals $I_1$ and $I_2$ to output a comparison result. As described above, the comparator CMP can output one of a first level signal, for instance, logic high and a second level signal, for instance, logic low as the comparison result. A counter CNT counts the number of the first level signals or the second level signals which are of the same kind among signals output from the comparator CMP in synchronization with a count clock signal (not shown). Thus, an analog signal can be converted into a digital signal and the converted signal can be output.

The ADC circuit of FIG. 14 can be commonly applied to the second ADC circuits (ADC2) 232a-232d. If the switching unit SWU is excluded from FIG. 14, FIG. 14 is the same as the drawing for explaining one column line of the pixel sensor array of FIG. 11 and a constitution and an operation of the first ADC circuits (ADC1) 231a-231c corresponding to the column line.

Figure 15A:
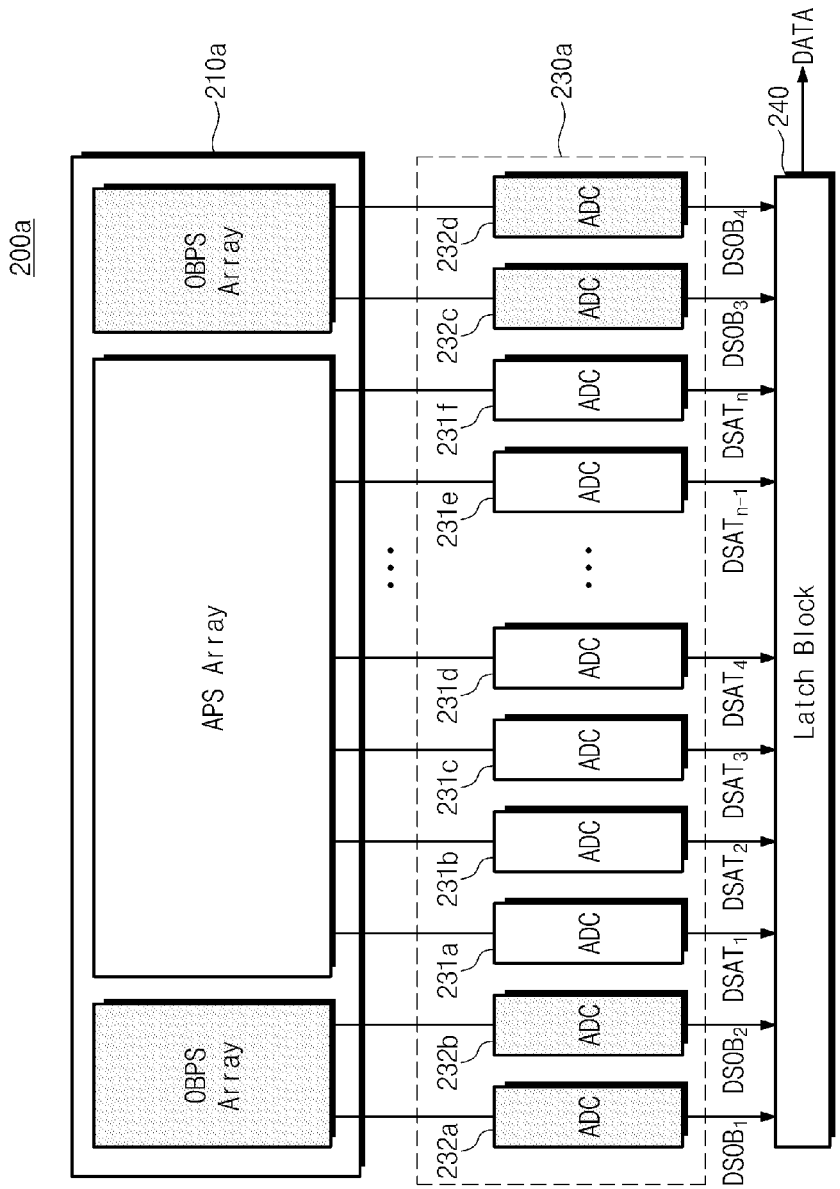
FIGS. 15A and 15B are drawings illustrating an exemplary embodiment of the image sensor of FIG. 11 according to an operation mode.
Figure 15B:
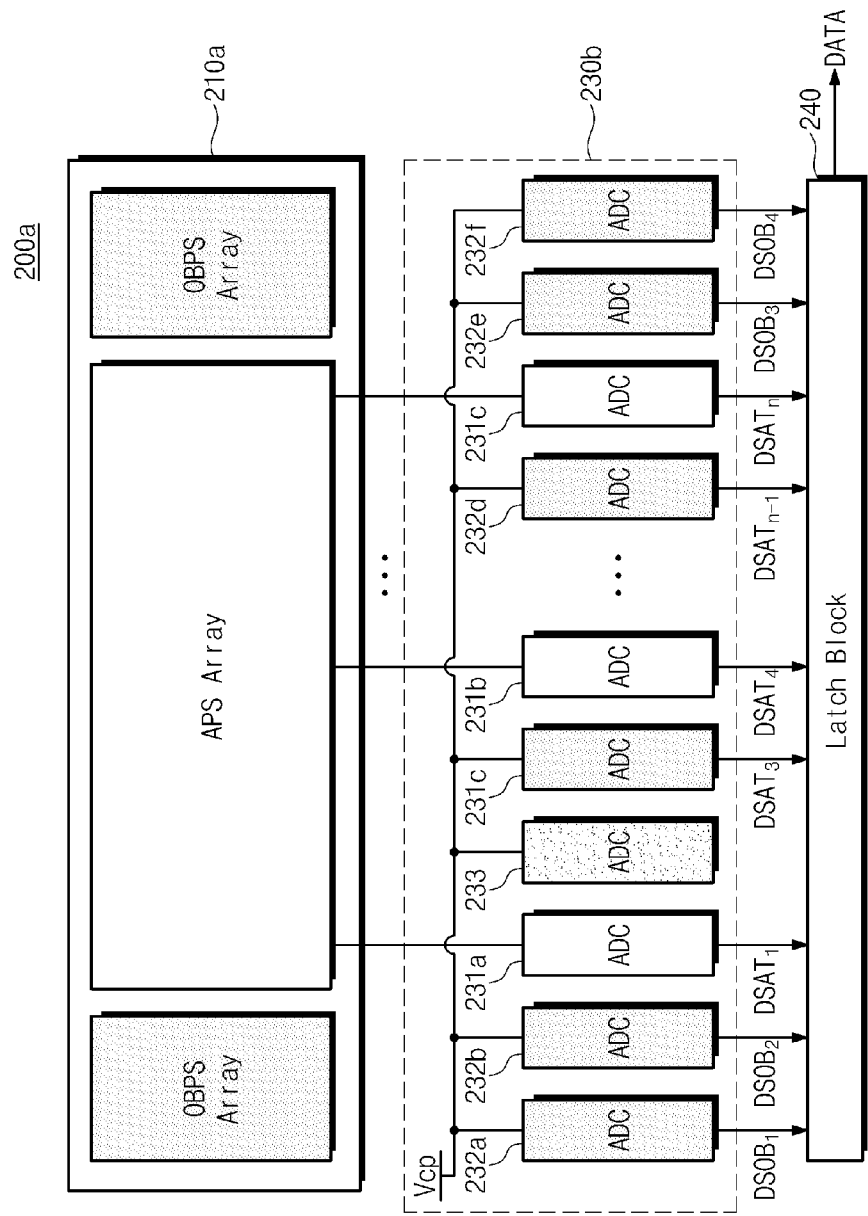

FIGS. 15A and 15B are drawings illustrating an exemplary embodiment of the image sensor 200 of FIG. 11 according to an operation mode.

Referring to FIGS. 15A and 15B, a pixel array 210a may include an active pixel region APR receiving incoming light to convert it into an electrical signal and an optical black region OBR blocking out incoming light to provide a reference of a black signal. In FIGS. 15A and 15B, the optical black pixel region OBR is disposed on both sides of the active pixel region APR. However, the inventive concept is not limited thereto. The optical black pixel region OBR may be disposed on any one of both sides of the active pixel region APR. The optical black pixel region OBR may be further provided on an upper or lower portion of the active pixel region APR.

In the case that light enters the image sensor 200a, an electrical signal generated by incident light entering the active pixel region APR. At this time, a plurality of ADC circuit having the same structure as the second ADC circuits (ADC2) 232a-232d described in FIGS. 11, 12A, and 12B may be connected to the optical black pixel region OBR. In FIGS. 15A and 15B, four ADC circuits 232a-232d are connected to the optical black pixel region OBR. However, the inventive concept is not limited thereto.

Since light cannot enter an optical black pixel OP of the optical black pixel region OBR by a light shielding pattern, only a noise signal may be output. As described with reference to FIG. 11, noise of a light sensing signal being output from the active pixel region APR can be compensated using a signal output from the optical black pixel region OBR, that is, an optical black signal as a noise compensation signal.

Since current consumption is large in the first operation mode, deviation of a drive power supply by row lines being provided to the pixel array 210a may be large. In this case, since a component of horizontal noise being generated from the pixel array 210a may be large, to compensate horizontal noise, it is desirable to use a signal being output from the optical black pixel OP as a noise compensation signal. Since current consumption is relatively small in the second operation mode, deviation of a drive power supply by row lines may be small. In this case, a component of horizontal noise being generated from the pixel array 210a is relatively small compared with a component of horizontal noise being generated from the analog to digital converter 230a. Since a component of random noise being generated from the pixel array 210a may look a component of horizontal noise, like the first operation mode, in the case that a signal being output from the optical black pixel OP is used as a noise compensation signal, since a component of horizontal noise being generated from the pixel array 210a is small, a compensation effect is low and a component of random noise of the optical black pixel OP may be added as the component of horizontal noise. Since a component of horizontal noise being from the analog to digital converter 230a is large, to remove a component of horizontal noise of the analog to digital converter 230a without reflection of a random noise component of the optical black pixel OP, by applying a DC voltage, for instance, a compensating input signal Vcp instead of an output of the optical black pixel OP to the ADC circuit corresponding to the optical black pixel OP, it can be output as a noise compensation signal. As described in FIG. 11, since the number of noise compensation signals increases, a compensation quantity becomes great, at least a part of ADC circuits not being used in a light detection among ADC circuits corresponding to the active pixel can be used to compensate a horizontal noise compensation as described with reference to FIG. 11.

Thus, in the image sensor 200a, in the first operation mode, as illustrated in FIG. 15A, a plurality of ADC circuits 231a-231f and 232a-232d receive a signal being output from the pixel array 210a to convert it into a digital signal and then output the converted digital signal. In the image sensor 200a, in the second operation mode, as illustrated in FIG. 15B, a part of ADC circuits 231a-231c, 232c, 232d, and 233, that is, the first ADC circuits (ADC1) 231a-231c receive a signal being output from the pixel array 210a to convert it into a digital signal and then output the converted digital signal. Other parts of ADC circuits 231a-231c, 232c, 232d, and 233 corresponding to the active pixel AP and ADC circuits corresponding to the optical black pixel OP, that is, second ADC circuits (ADC2) 232c and 232d can convert a compensating input signal Vcp into a digital signal and then output the converted digital signal. Another part of ADC circuits 231a-231c, 232c, 232d, and 233 corresponding to the active pixel AP, that is, third ADC circuit (3 ADC) 233 may not operate. As the number of operating ADC circuits increases, current consumption becomes great. Thus, considering an image quality and current consumption, the number of ADC circuits being selected as the second ADC circuits (ADC2) 232a-232f can be controlled.

Figure 16A:
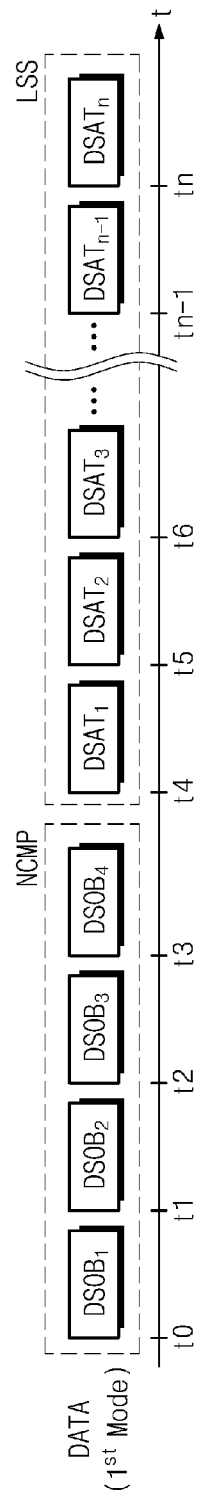
FIGS. 16A and 16B are drawings for illustrating the order of data being output from a latch block of FIGS. 15A and 15B according to an operation mode.
Figure 16B:
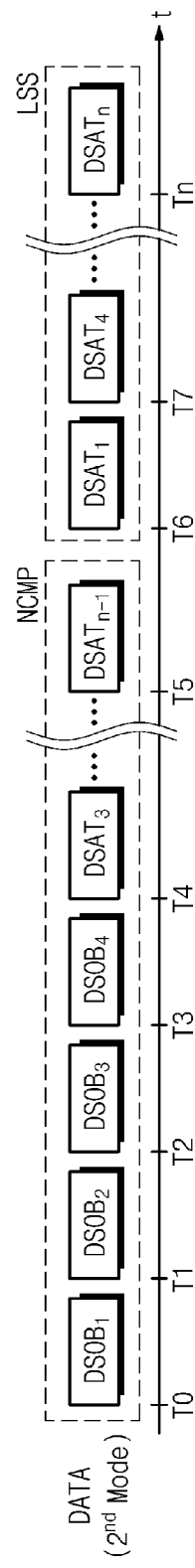

FIGS. 16A and 16B are drawings for illustrating the order of data being output from a latch block of FIGS. 15A and 15B according to an operation mode.

Referring to FIG. 16A, in the first operation mode, signals DSOB1-DSOB4 being output from an ADC circuit corresponding to the optical black pixel OP are output as a noise compensation signal NCS and then signals DSAT1-DSATn being output from an ADC circuit corresponding to the active pixel AP can be output as a light sensing signal LSS. The signals DSOB1-DSOB4 being output from an ADC circuit corresponding to the optical black pixel OP reflect a component of horizontal noise of the pixel array 210a. The time order is t0<t1<t2< . . . <tn. That is, in the drawing, signals on the left are output first.

Referring to FIG. 16B, in the second operation mode, signals DSOB1-DSOB4 and DSAT3-DSATn-1 being output from the second ADC circuits (ADC2) 232a-222f are output first as a noise compensation signal NCS and then signals DSAT1 and DSAT4, . . . , DSATn-1 being output from the first ADC circuits (ADC1) 231a-231c may be output as a light sensing signal LSS. The time order is T0<T1<T2< . . . <Tn. That is, in the drawing, signals on the left are output first.

Figure 17:
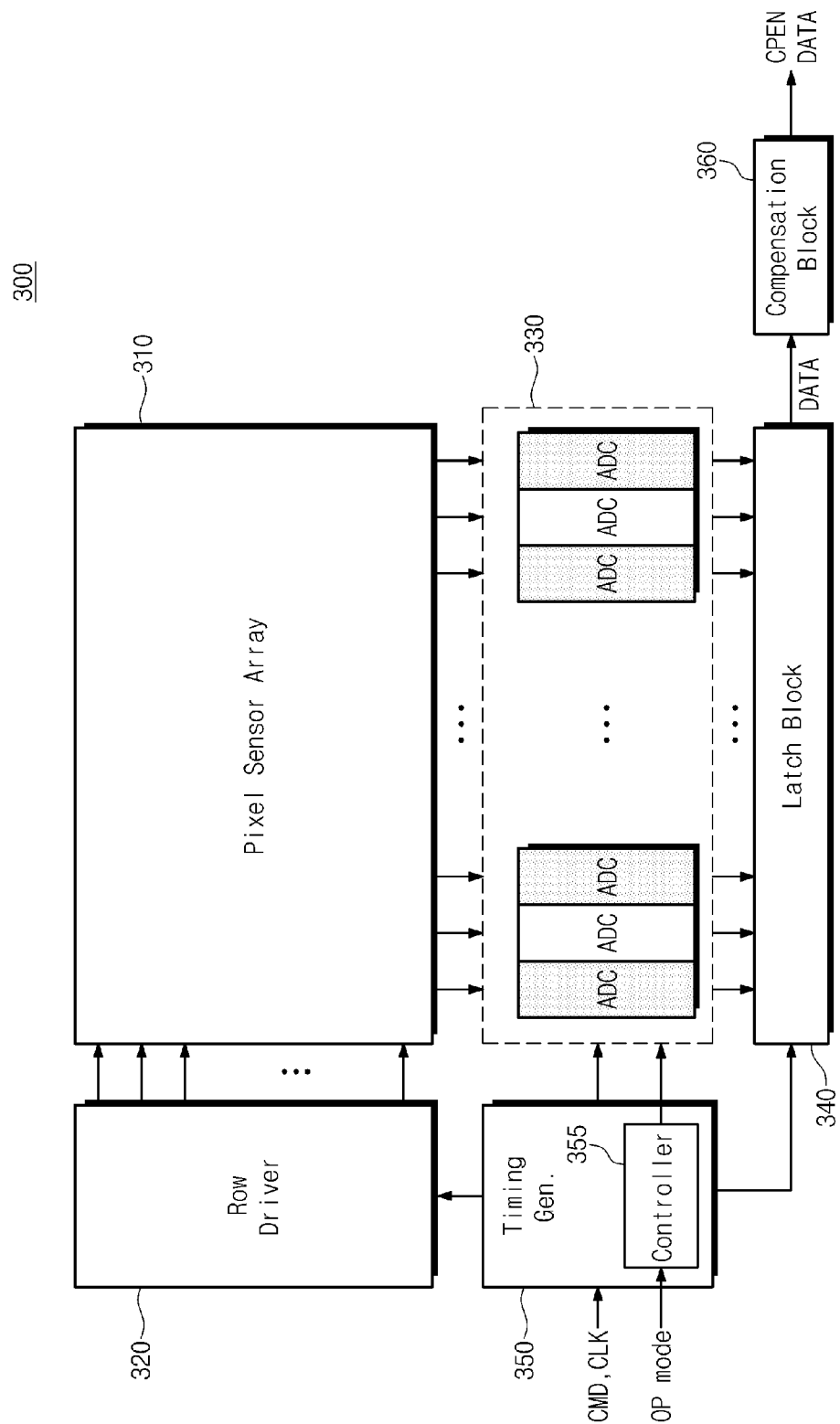
FIG. 17 is a block diagram illustrating another exemplary embodiment of the image sensor of FIG. 11.

FIG. 17 is a block diagram another exemplary embodiment of the image sensor of FIG. 11. Referring to FIG. 17, an image sensor 300 includes a pixel sensor array 310, a row driver 320, an analog to digital converter 330, a latch block 340, and a timing generator 350. The image sensor 300 may further include a controller 355 and a compensation unit 360. The pixel sensor array 310, the row driver 320, the analog to digital converter 330, the latch block 340, and the timing generator 350 are the same as those of FIG. 11. Thus, description thereof will be omitted.

The controller 355 can control the analog to digital converter 330 according to an operation mode OP mode being applied from the outside and a setting value. The controller 355 can select a plurality of first ADC circuits, a plurality of second ADC circuits, and a plurality of third ADC circuits among a plurality of ADC circuits included in the analog to digital converter 330. In FIG. 17, the controller 355 is included in the timing generator 350. However, the inventive concept is not limited thereto. The controller 355 may be separately provided outside the timing generator 350.

The compensation unit 360 performs a noise compensation operation on a light sensing signal being output from the pixel sensor array 310 on the basis of a signal DATA provided from the latch block 340. As described above, the latch block 340 outputs a plurality of noise compensation signal NCS and then sequentially outputs a plurality of light sensing signals LSS. Thus, the compensation unit 360 generates a compensation reference signal on the basis of the noise compensation signals NCS and then can compensate the light sensing signals LSS using the compensation reference signal. The compensation reference signal is average values of the noise compensation signals NCS and can compensate noise of the light sensing signal LSS, in particular, horizontal noise. The compensated value CPEN DATA may be output to the outside, for example, an image signal processing unit ISP.

Figure 18:
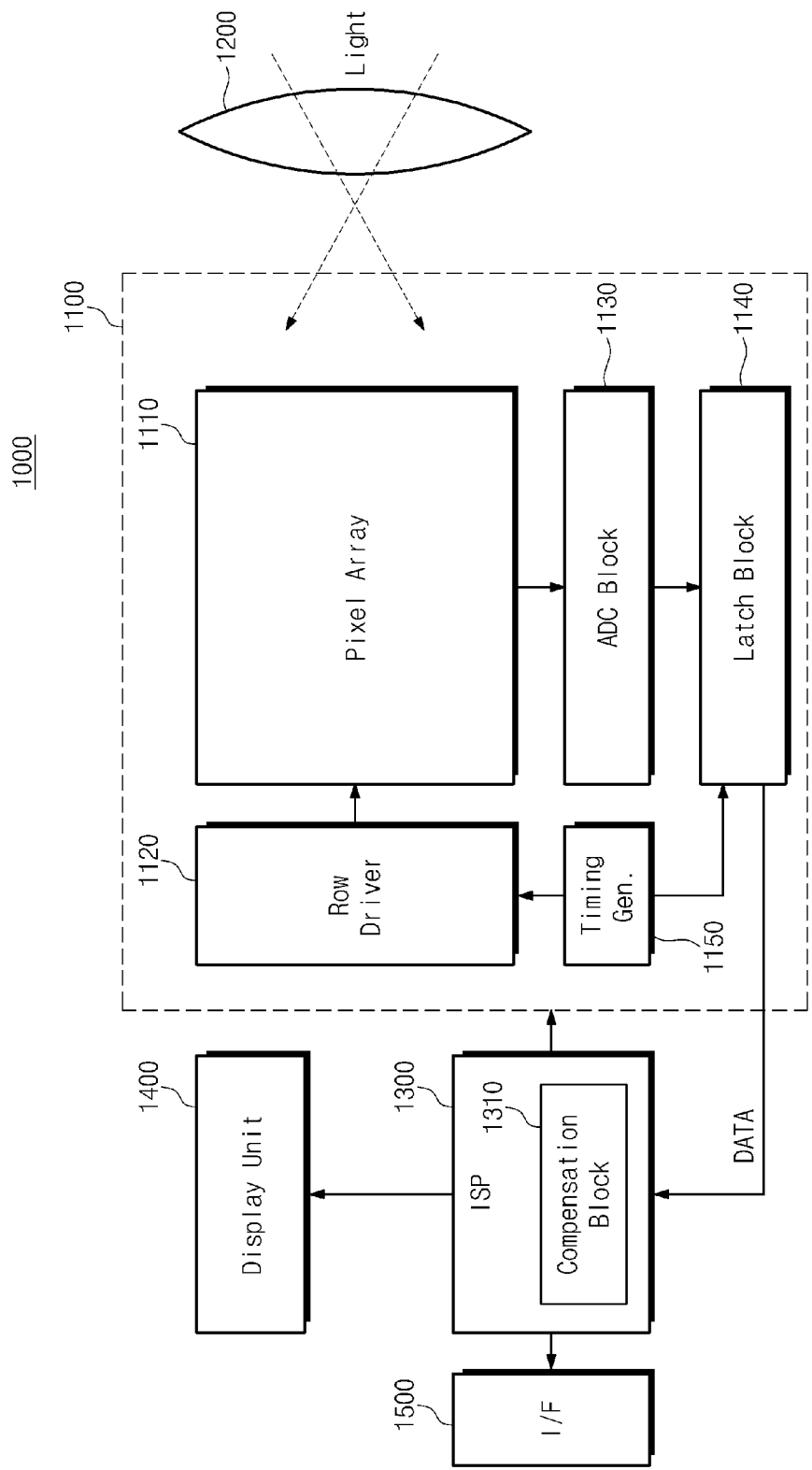
FIG. 18 is a block diagram illustrating an imaging device in accordance with an exemplary embodiment of the inventive concept.

FIG. 18 is a block diagram illustrating an imaging device in accordance with an exemplary embodiment of the inventive concept.

An imaging device 1000 converts light into an electrical signal to generate image data and may include an image sensor 1100, a module lens 1200, and an image signal processor 1300. The imaging device 1000 may further include a display unit 1400 and an interface unit (I/F) 1500. The imaging device 1000 includes a digital camera and a data processing device including the digital camera, such as a personal computer (PC), a mobile phone, a smart phone, a tablet PC, or an information technology (IT) device.

The module lens 1200 can refract light entering from an external subject of the imaging device 1000 and form an image on the image sensor 1100. The image sensor 1100 can absorb light incoming through the module lens 1200.

The image sensor 1100 may be one of the image sensors 100, 200, and 300 in accordance with the exemplary embodiments of the inventive concept or an image sensor which can be easily designed from the image sensors 100, 200, and 300. When the image sensor 1100 operates in a sub sampling mode such as a moving image mode and a low image quality mode, the image sensor 1100 can use ADC circuits which are not used to convert a light sensing signal being output from the pixel sensor array 1110 into a digital signal to reduce horizontal noise of the light sensing signal.

The image signal processor 1300 can process a signal DATA received from the image sensor 1100 to provide the processed signal to the display unit 1400 or the interface unit 1500. The image signal processor 1300 can also control the image sensor 1100 on the basis of a characteristic of picked-up image data. The image signal processor 1300 includes a compensation block 1310 and the compensation block 1310 can perform a noise compensation operation on the basis of a signal DATA being received from the image sensor 1100. However, this is only an illustration and the inventive concept is not limited thereto. The compensation block 1310 can be separately provided and can be provided in the image sensor 1100 as described with reference to FIG. 17.

The display unit 1400 displays image data received from the image processor 1300 and the interface unit 1500 transmits data to an external device or receives data from an external device.

Figure 19:
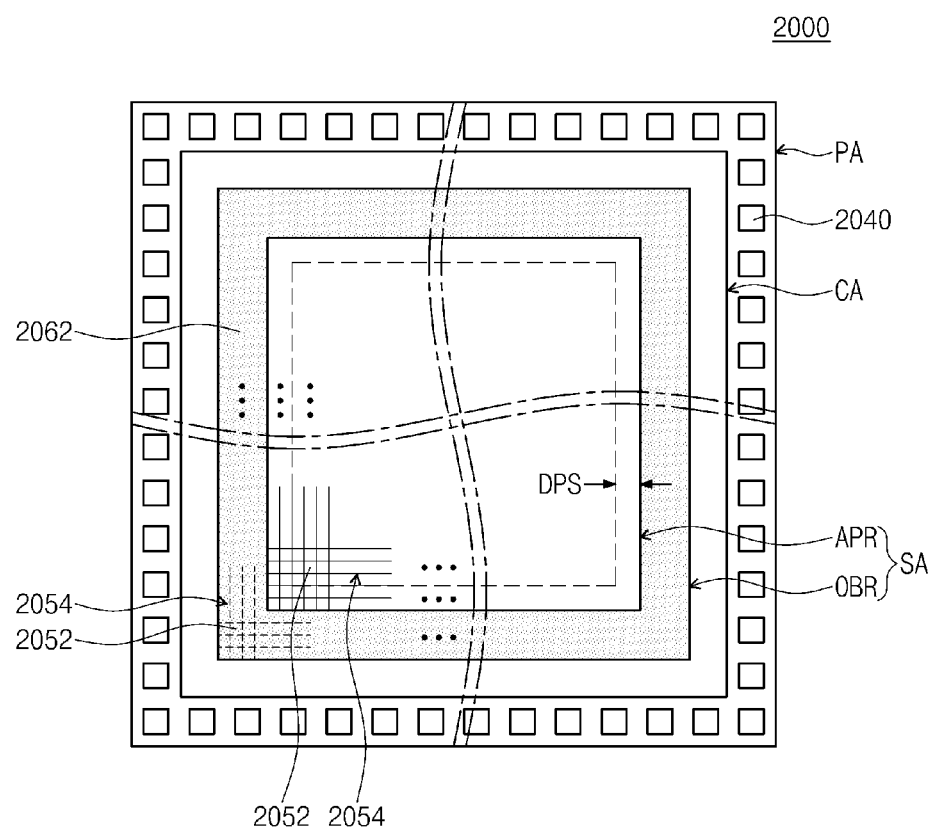
FIG. 19 is a drawing illustrating a plane arrangement of an image sensor in accordance with exemplary embodiments of the inventive concept.

FIG. 19 is a drawing illustrating a plane arrangement of an image sensor in accordance with exemplary embodiments of the inventive concept.

Referring to FIG. 19, an image sensor 2000 includes a sensor array area SA, a circuit area CA including a plurality of circuits 2062 formed around the sensor array area SA, and a pad area PA including a plurality of pads 2040 disposed around the circuit area CA. The sensor array area SA includes an active pixel region APR including active pixels for generating an active signal corresponding to wavelengths of light from the outside and an optical black region OBR including an optical black pixel OP for generating an optical black signal. A dummy pixel sensor region DPS may be disposed on an edge part near the optical black pixel region OBR among the active pixel region APR. In some exemplary embodiments, the dummy pixel sensor region may be omitted.

In some exemplary embodiments, the pads 2040 formed in the pad area PA exchange an electrical signal with an external device. In some other exemplary embodiments, the pads 2040 performs a function of transmitting a drive power supply such as a power supply voltage or a ground voltage being provided from the outside to circuits disposed on the circuit area CA.

The pixel array area SA comprises a pixel array 2054 including a plurality of unit pixels 2052. Each of the unit pixels 2052 includes a photoelectric conversion device (not shown).

The circuit area CA includes a plurality of CMOS transistors (not shown). The circuit area CA provides a specific signal to each unit pixel 2052 of the sensor array area SA or controls an output signal from each unit pixel 2052.

In the sensor array area SA, a plurality of unit pixels 2052 formed in the optical black pixel region OBR is covered with a light shielding pattern 2062. The unit pixels 2052 formed in the optical black pixel region OBR can be used to measure a dark current. A power supply which is the same as a power supply being supplied to the pixel array 2054 in the active pixel sensor region APR and the dummy pixel sensor region DPS may be connected to the pixel array 2054 in the optical black sensor region OBR. Thus, it is possible to transmit noise which is the same noise as the power supply noise generated from the active pixel sensor region APR through an output signal of the optical black pixel region OBR. Since light entering the pixel array 2054 in the optical black pixel region OBR is blocked out by a light shielding pattern 2062, a component of power supply noise can be transmitted using a black level signal being generated from the pixel array 2054 in the optical black pixel region OBR.

Figure 20:
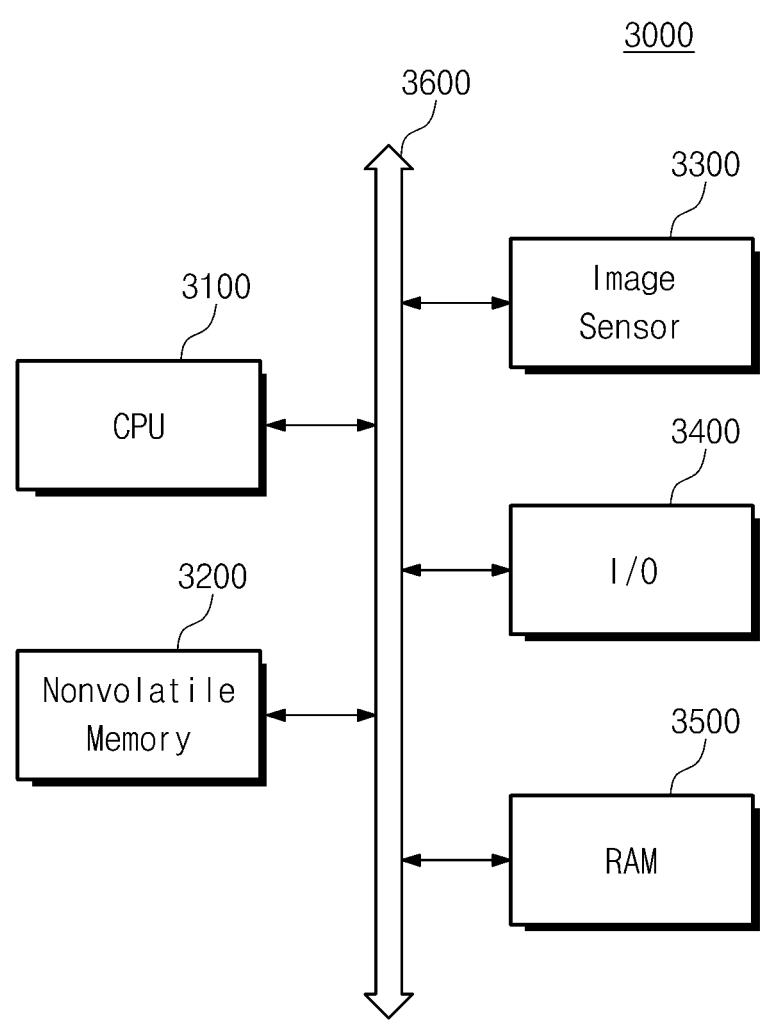
FIG. 20 is a block diagram illustrating a system including an image sensor in accordance with exemplary embodiments of the inventive concept.

FIG. 20 is a block diagram illustrating a system including an image sensor in accordance with exemplary embodiments of the inventive concept. A system 3000 may be any one of a computing system, a camera system, a scanner, vehicle navigation, a video phone, a security system, or a motion detecting system that needs image data.

As illustrated in FIG. 20, the system 3000 may include a central processing unit 3100, a nonvolatile memory 3200, an image sensor 3300, an input/output device 3400 and a RAM 3500. The central processing unit 3100 can communicate with the nonvolatile memory 3200, the image sensor 3300, the input/output device 3400, and the RAM 3500 through a bus 3600. The image sensor 3300 can be embodied by an independent semiconductor chip or can be combined with the central processing unit 3100 to be embodied by one semiconductor chip.

The image sensor 3300 may be one of the image sensors 100, 200, and 300 in accordance with the exemplary embodiments of the inventive concept or an image sensor which can be easily designed from the image sensors 100, 200, and 300. When the image sensor 3300 operates in a sub sampling mode such as a moving image mode and a low image quality mode, the image sensor 3300 can use ADC circuits which are not used to convert a light sensing signal being output from the pixel array into a digital signal to reduce horizontal noise of the light sensing signal.

Figure 21:
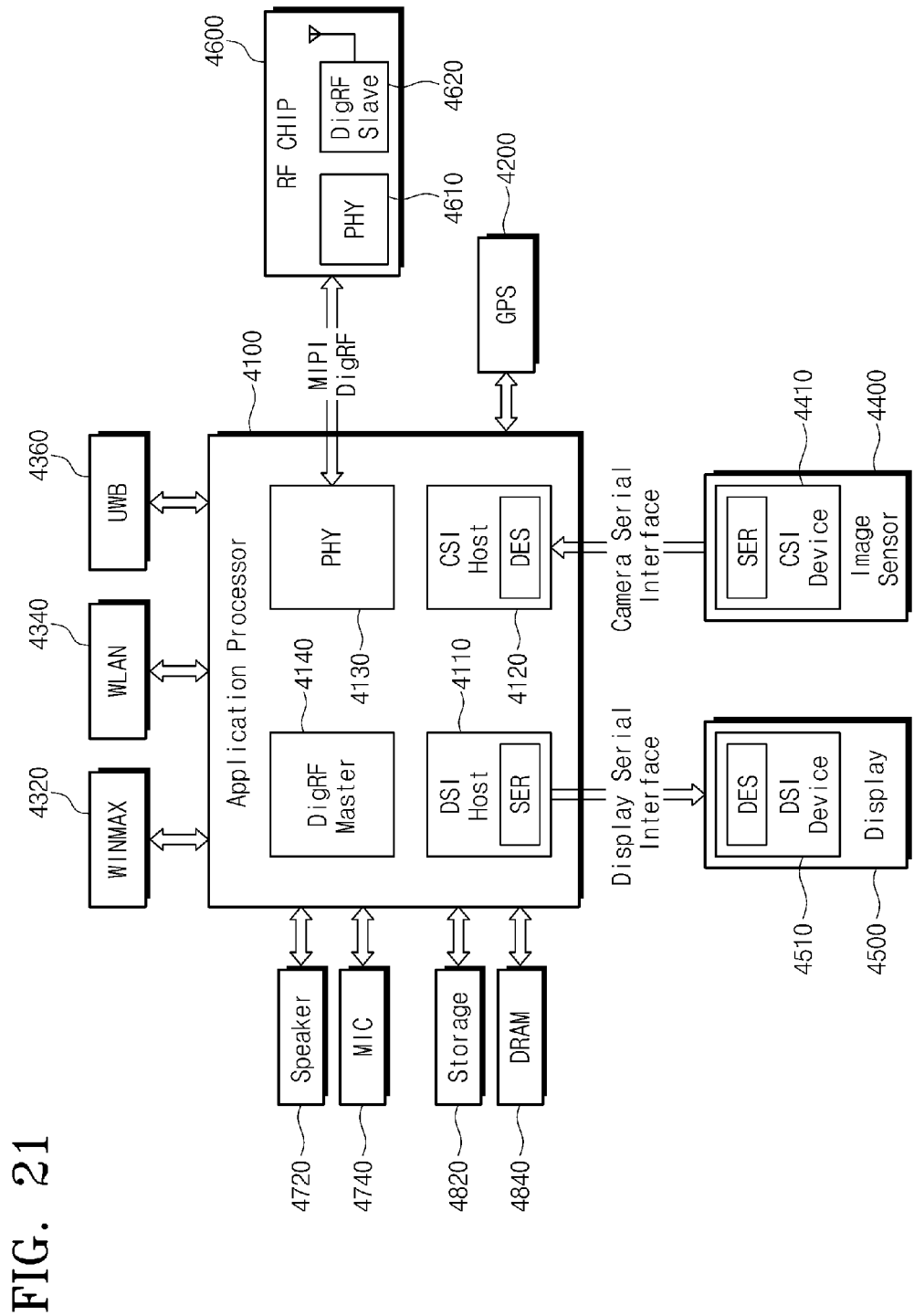
FIG. 21 is a block diagram illustrating an electronic system including an image sensor in accordance with exemplary embodiments of the inventive concept.

FIG. 21 is a block diagram illustrating an electronic system including an image sensor in accordance with exemplary embodiments of the inventive concept. Referring to FIG. 21, the electronic system 4000 can be embodied by a data processing device that can use or support a mipi alliance (mipi) interface, such as a mobile phone, a personal digital assistant (PDA), a portable media player (PMP), or a smart phone. The electronic system 4000 may include an application processor 4100, an image sensor 4400, and a display 4500.

A camera serial interface (CSI) host 4120 embodied in the application processor 4100 can serially communicate with a CSI device 4410 of the image sensor 4400 through a camera serial interface CSI. A light deserializer can be embodied in the CSI host 4120 and a light serializer can be embodied in the CSI device 4410.

A display serial interface (DSI) host 4110 embodied in the application processor 4100 can serially communicate with a DSI device 4510 of the display 4500 through a display serial interface DSI. A light serializer can be embodied in the DSI host 4110 and a light deserializer can be embodied in the DSI device 4510.

The electronic system 4000 can further include a radio frequency (RF) chip 4600 that can communicate with the application processor 4100. A physical layer (PHY) 4130 of the electronic system 4000 and a PHY 4610 of an RF chip 4600 can exchange data with each other according to MIPI DigRF.

The electronic system 4000 can further include a global positioning system (GPS) 4200, a storage 4820, a DRAM 4840, a speaker 4720, and a microphone 4740, and can communicate using a worldwide interoperability for microwave access (Wimax) 4320, a wireless local area network (WLAN) 434,0 and a ultra-wide band (UWB) 4360.

According to the exemplary embodiments of the inventive concept, horizontal noise HN due to the same noise power can be removed by forming heterogeneous analog to digital converters in an image sensor. Thus, according to the image sensor of the inventive concept, horizontal noise can be effectively removed without a large change of existing structure and an overhead of a chip area.

The foregoing is illustrative of the inventive concept and is not to be construed as limiting thereof. Although a few exemplary embodiments of the inventive concept have been described, those skilled in the art will readily appreciate that many modifications are possible in the embodiments without materially departing from the novel teachings and advantages. Accordingly, all such modifications are intended to be included within the scope of the exemplary embodiments as defined in the claims. The exemplary embodiments are defined by the following claims, with equivalents of the claims to be included therein

What is claimed is:

1. An image sensor comprising:
a pixel sensor array which comprises an active pixel sensor and an optical black pixel sensor;
a first analog to digital converter configured to convert a first sensing signal, which is provided from the active pixel sensor, to a first digital signal;
a second analog to digital converter configured to convert a second sensing signal, which is provided from the optical black pixel sensor, to a second digital signal; and
an output buffer configured to temporarily store and output the first digital signal and the second digital signal,
wherein a noise characteristic of the second analog to digital converter is different from a noise characteristic of the first analog to digital converter.

2. The image sensor of claim 1, wherein the second analog to digital converter comprises a plurality of analog to digital converting circuits which are configured to convert the second sensing signal into the second digital signal.

3. The image sensor of claim 2, wherein each of the analog to digital converting circuits comprises a same circuit structure and a same chip area.

4. The image sensor of claim 2, further comprising:
a full adder configured to merge a plurality of digital signals, which are output from the analog to digital converting circuits, to convert them into digital data which corresponds to one column.

5. The image sensor of claim 2, wherein each of the analog to digital converting circuits comprise:
a comparator configured to compare the second sensing signal with a ramp signal to convert the second sensing signal into a time axis length information; and
a counter configured to convert the time axis length information into a digital signal.

6. The image sensor of claim 1, wherein the second analog to digital converter comprises one analog to digital converting circuit configured to sequentially process a plurality of second sensing signals provided from at least two columns.

7. The image sensor of claim 6, further comprising:
a multiplexer configured to sequentially select the second sensing signals, and then transmit the selected second sensing signals to an input stage of the one analog to digital converting circuit.

8. The image sensor of claim 6, further comprising:
a demultiplexer configured to select a plurality of digital signals which respectively correspond to the second sensing signals, and then sequentially transmit the selected digital signals to the output buffer.

9. The image sensor of claim 6, wherein random noise of the second analog to digital converter is smaller than random noise of the first analog to digital converter.

10. The image sensor of claim 1, further comprising:
a timing controller configured to control a plurality of operations of the pixel sensor array, the first analog to digital converter, the second analog to digital converter, and the output buffer.

11. An image sensor comprising:
an active pixel sensor array which comprises a plurality of active pixel sensors arranged in a first matrix form of a first plurality of rows and a first plurality of columns;
an optical black pixel sensor array which comprises a plurality of optical black pixel sensors arranged in a second matrix form of the first rows and at least one second column:
a first analog to digital converter configured to convert a first sensing signal being provided from the active pixel sensor array; and
a second analog to digital converter configured to convert a second sensing signal being provided from the optical black pixel sensor array,
wherein noise characteristic of the second analog to digital converter is different from that of the first analog to digital converter,
wherein the optical black pixel sensors are shielded from external light, and wherein the active pixel sensors sense light and convert the sensed light to a plurality of signals to output through the first plurality of columns.

12. The image sensor of claim 11, wherein top surfaces of each of the optical black pixel sensors are covered with a light shield to shield the external light.

13. The image sensor of claim 11, wherein each of the active pixel sensors senses light using a photoelectric conversion device.

14. The image sensor of claim 11, wherein each of the active pixel sensors comprises at least one of a red filter, a green filter, and a blue filter.

15. The image sensor of claim 11, wherein each of the active pixel sensors comprises a plurality of transistors.

* * * * *